United States Patent
Goto et al.

(10) Patent No.: US 12,483,226 B2
(45) Date of Patent: Nov. 25, 2025

(54) ACOUSTIC WAVE DEVICE WITH TILTED MULTILAYER INTERDIGITAL TRANSDUCER ELECTRODE

(71) Applicant: Skyworks Solutions, Inc., Irvine, CA (US)

(72) Inventors: Rei Goto, Osaka (JP); Gong Bin Tang, Moriguchi (JP); Yuya Hiramatsu, Neyagawa (JP); Hironori Fukuhara, Ibaraki (JP)

(73) Assignee: Skyworks Solutions, Inc., Irvine, CA (US)

( * ) Notice: Subject to any disclaimer, the term of this patent is extended or adjusted under 35 U.S.C. 154(b) by 135 days.

(21) Appl. No.: 18/145,246

(22) Filed: Dec. 22, 2022

(65) Prior Publication Data

US 2023/0208398 A1    Jun. 29, 2023

Related U.S. Application Data

(60) Provisional application No. 63/294,806, filed on Dec. 29, 2021.

(51) Int. Cl.
*H03H 9/64* (2006.01)
*H03H 9/02* (2006.01)
*H03H 9/145* (2006.01)

(52) U.S. Cl.
CPC ...... *H03H 9/6473* (2013.01); *H03H 9/02574* (2013.01); *H03H 9/14541* (2013.01); *H03H 9/14594* (2013.01); *H03H 9/6483* (2013.01)

(58) Field of Classification Search
CPC ............... H03H 9/6483; H03H 9/6473; H03H 9/02574; H03H 9/14541; H03H 9/14594

USPC .................................................. 333/186–193
See application file for complete search history.

(56) References Cited

U.S. PATENT DOCUMENTS

| | | | |
|---|---|---|---|
| 5,646,584 | A | 7/1997 | Kondratyev et al. |
| 5,895,996 | A | 4/1999 | Takagi et al. |
| 7,230,512 | B1 | 6/2007 | Carpenter et al. |
| 7,352,104 | B2 | 4/2008 | Yamazaki et al. |

(Continued)

FOREIGN PATENT DOCUMENTS

| CN | 113098432 A | 7/2021 |
|---|---|---|
| FR | 3105894 A1 | 7/2021 |

(Continued)

OTHER PUBLICATIONS

Iwamoto et al., "Transverse Modes in I.H.P. SAW Resonator and Their Suppression Method", Murata Manufacturing co., Ltd., (2018).

(Continued)

*Primary Examiner* — Rakesh B Patel
(74) *Attorney, Agent, or Firm* — Knobbe, Martens, Olson & Bear, LLP

(57) ABSTRACT

An acoustic wave device is disclosed. The acoustic wave device can include a multilayer piezoelectric substrate and an interdigital transducer electrode over the multilayer piezoelectric substrate. The interdigital transducer electrode includes a first layer and a second layer over the first layer. The interdigital transducer electrode has a tilt angle of at least 12 degrees. The acoustic wave device being configured to generate a surface acoustic wave having a wavelength L.

20 Claims, 14 Drawing Sheets

(56) References Cited

U.S. PATENT DOCUMENTS

| | | | |
|---|---|---|---|
| 7,554,242 B2* | 6/2009 | Aoki | H03H 3/08 |
| | | | 333/195 |
| 8,294,331 B2 | 10/2012 | Abbott et al. | |
| 8,741,683 B2 | 6/2014 | Huang et al. | |
| 9,065,424 B2 | 6/2015 | Nakanishi et al. | |
| 9,124,240 B2 | 9/2015 | Shimizu et al. | |
| 9,136,458 B2 | 9/2015 | Komatsu et al. | |
| 9,257,960 B2 | 2/2016 | Ruile et al. | |
| 9,413,330 B2 | 8/2016 | Shimizu et al. | |
| 9,419,584 B2 | 8/2016 | Tsurunari et al. | |
| 9,438,201 B2 | 9/2016 | Hori et al. | |
| 9,537,464 B2 | 1/2017 | Yamanaka | |
| 9,640,750 B2 | 5/2017 | Nakanishi et al. | |
| 9,641,152 B2 | 5/2017 | Nakamura et al. | |
| 9,673,779 B2 | 6/2017 | Ruile et al. | |
| 9,748,923 B2 | 8/2017 | Kando et al. | |
| 9,748,924 B2 | 8/2017 | Komatsu et al. | |
| 10,090,825 B2 | 10/2018 | Kuroyanagi | |
| 10,153,748 B2 | 12/2018 | Tanaka | |
| 10,361,678 B2 | 7/2019 | Iwaki et al. | |
| 10,476,470 B2 | 11/2019 | Takamine | |
| 10,483,942 B2 | 11/2019 | Goto et al. | |
| 10,574,207 B2 | 2/2020 | Yoon et al. | |
| 10,727,844 B1 | 7/2020 | Gong et al. | |
| 10,749,497 B2 | 8/2020 | Tang et al. | |
| 10,826,507 B1 | 11/2020 | Gong et al. | |
| 10,873,313 B2 | 12/2020 | Zou et al. | |
| 11,050,406 B2 | 6/2021 | Maki et al. | |
| 11,095,266 B2 | 8/2021 | Inoue et al. | |
| 11,165,411 B2 | 11/2021 | Liu et al. | |
| 11,239,817 B2 | 2/2022 | Hatano | |
| 11,245,378 B2 | 2/2022 | Tang et al. | |
| 11,296,672 B2 | 4/2022 | Hiratsuka et al. | |
| 11,368,137 B2 | 6/2022 | Goto et al. | |
| 11,522,514 B2 | 12/2022 | Zou et al. | |
| 11,606,078 B2 | 3/2023 | Tang et al. | |
| 11,616,491 B2 | 3/2023 | Tang et al. | |
| 11,677,380 B2* | 6/2023 | Fujiwara | H03H 9/14564 |
| | | | 333/193 |
| 11,722,122 B2 | 8/2023 | Goto et al. | |
| 11,750,172 B2 | 9/2023 | Goto et al. | |
| 11,824,515 B2 | 11/2023 | Tang et al. | |
| 11,962,283 B2 | 4/2024 | Zou et al. | |
| 12,040,784 B2 | 7/2024 | Tang et al. | |
| 12,047,053 B2 | 7/2024 | Maki et al. | |
| 2004/0222717 A1* | 11/2004 | Matsuda | H03H 9/02866 |
| | | | 310/313 R |
| 2005/0077982 A1* | 4/2005 | Funasaka | H03H 9/02574 |
| | | | 333/195 |
| 2005/0127781 A1 | 6/2005 | Yamazaki et al. | |
| 2008/0018417 A1* | 1/2008 | Igaki | H03H 9/02559 |
| | | | 333/195 |
| 2010/0265010 A1 | 10/2010 | Jian | |
| 2012/0049968 A1 | 3/2012 | Owaki et al. | |
| 2014/0285287 A1 | 9/2014 | Komatsu et al. | |
| 2014/0339957 A1 | 11/2014 | Tajima et al. | |
| 2016/0261038 A1 | 9/2016 | Tanaka | |
| 2016/0294361 A1 | 10/2016 | Yamane et al. | |
| 2017/0063332 A1 | 3/2017 | Gilbert et al. | |
| 2017/0099043 A1 | 4/2017 | Goto et al. | |
| 2017/0104470 A1* | 4/2017 | Koelle | H03H 9/14535 |
| 2017/0214385 A1 | 7/2017 | Bhattacharjee | |
| 2017/0214386 A1 | 7/2017 | Kido | |
| 2017/0222618 A1 | 8/2017 | Inoue et al. | |
| 2017/0250669 A1 | 8/2017 | Kuroyanagi et al. | |
| 2017/0272051 A1 | 9/2017 | Kurihara et al. | |
| 2017/0273183 A1 | 9/2017 | Kawasaki et al. | |
| 2017/0288629 A1 | 10/2017 | Bhattacharjee et al. | |
| 2017/0359048 A1 | 12/2017 | Yasuda | |
| 2018/0013404 A1 | 1/2018 | Kawasaki et al. | |
| 2018/0048290 A1 | 2/2018 | Sekine et al. | |
| 2018/0097501 A1* | 4/2018 | Kikuchi | H03H 9/14541 |
| 2018/0097508 A1 | 4/2018 | Iwamoto et al. | |
| 2018/0102755 A1 | 4/2018 | Takamine | |
| 2018/0102760 A1* | 4/2018 | Inoue | H10N 30/8542 |
| 2018/0138893 A1 | 5/2018 | Caron | |
| 2018/0316329 A1 | 11/2018 | Guenard et al. | |
| 2018/0367119 A1 | 12/2018 | Lee | |
| 2019/0288661 A1 | 9/2019 | Akiyama et al. | |
| 2019/0319772 A1 | 10/2019 | Ando et al. | |
| 2019/0379347 A1 | 12/2019 | Goto et al. | |
| 2020/0036362 A1 | 1/2020 | Daimon | |
| 2020/0067482 A1 | 2/2020 | Maki et al. | |
| 2020/0106420 A1 | 4/2020 | Kodama et al. | |
| 2020/0144984 A1 | 5/2020 | Fukuhara et al. | |
| 2020/0212875 A1 | 7/2020 | Goto et al. | |
| 2020/0212876 A1 | 7/2020 | Goto et al. | |
| 2020/0212883 A1 | 7/2020 | Goto et al. | |
| 2020/0220522 A1 | 7/2020 | Nosaka | |
| 2020/0358424 A1 | 11/2020 | Kaneda et al. | |
| 2020/0366268 A1 | 11/2020 | Goto et al. | |
| 2020/0366270 A1 | 11/2020 | Matsuoka | |
| 2020/0389151 A1 | 12/2020 | Goto | |
| 2021/0006225 A1 | 1/2021 | Hatano | |
| 2021/0050842 A1 | 2/2021 | Tang et al. | |
| 2021/0058057 A1 | 2/2021 | Goto et al. | |
| 2021/0126616 A1 | 4/2021 | Hiramatsu et al. | |
| 2021/0167748 A1 | 6/2021 | Huck et al. | |
| 2021/0297060 A1 | 9/2021 | Omura et al. | |
| 2022/0014152 A1 | 1/2022 | Gebeyehu et al. | |
| 2022/0014175 A1 | 1/2022 | Nagatomo et al. | |
| 2022/0077840 A1 | 3/2022 | Caron | |
| 2022/0109419 A1 | 4/2022 | Esquius Morote | |
| 2022/0209738 A1 | 6/2022 | Torazawa et al. | |
| 2022/0271730 A1 | 8/2022 | Abbott et al. | |
| 2022/0271733 A1 | 8/2022 | Abbott et al. | |
| 2022/0271734 A1 | 8/2022 | Abbott et al. | |
| 2022/0328980 A1 | 10/2022 | Dicarlo et al. | |
| 2022/0360249 A1 | 11/2022 | Ballandras et al. | |
| 2022/0399867 A1 | 12/2022 | Goto et al. | |
| 2022/0399871 A1 | 12/2022 | Goto et al. | |
| 2023/0013597 A1 | 1/2023 | Goto et al. | |
| 2023/0016884 A1 | 1/2023 | Goto et al. | |
| 2023/0026465 A1 | 1/2023 | Huang et al. | |
| 2023/0031568 A1 | 2/2023 | Tang et al. | |
| 2023/0032325 A1 | 2/2023 | Goto et al. | |
| 2023/0039507 A1 | 2/2023 | Kim et al. | |
| 2023/0104405 A1 | 4/2023 | Hiramatsu et al. | |
| 2023/0105726 A1 | 4/2023 | Tang et al. | |
| 2023/0107376 A1 | 4/2023 | Goto et al. | |
| 2023/0109106 A1 | 4/2023 | Hiramatsu et al. | |
| 2023/0112677 A1 | 4/2023 | Tang et al. | |
| 2023/0163748 A1 | 5/2023 | Goto et al. | |
| 2023/0208385 A1 | 6/2023 | Hiramatsu et al. | |
| 2023/0208396 A1 | 6/2023 | Hiramatsu et al. | |
| 2023/0208399 A1 | 6/2023 | Goto et al. | |
| 2023/0223910 A1 | 7/2023 | Goto et al. | |
| 2023/0223917 A1 | 7/2023 | Goto et al. | |
| 2023/0231529 A1 | 7/2023 | Hiramatsu et al. | |
| 2023/0275565 A1 | 8/2023 | Tang et al. | |
| 2023/0283261 A1 | 9/2023 | Huang et al. | |
| 2023/0327630 A1 | 10/2023 | Goto et al. | |
| 2023/0327642 A1 | 10/2023 | Goto et al. | |
| 2023/0327645 A1 | 10/2023 | Goto et al. | |
| 2023/0336152 A1 | 10/2023 | Goto et al. | |
| 2023/0336153 A1 | 10/2023 | Goto et al. | |
| 2023/0336159 A1 | 10/2023 | Hiramatsu et al. | |
| 2023/0344411 A1 | 10/2023 | Chen et al. | |
| 2023/0344415 A1 | 10/2023 | Chen et al. | |
| 2023/0344416 A1 | 10/2023 | Chen et al. | |
| 2024/0022164 A1 | 1/2024 | Gong et al. | |
| 2024/0039507 A1 | 2/2024 | Goto et al. | |
| 2024/0186978 A1 | 6/2024 | Hiramatsu et al. | |
| 2024/0223149 A1 | 7/2024 | Goto et al. | |
| 2024/0223152 A1 | 7/2024 | Goto et al. | |
| 2024/0223156 A1 | 7/2024 | Goto et al. | |
| 2024/0364305 A1 | 10/2024 | Goto | |

(56) References Cited

U.S. PATENT DOCUMENTS

FOREIGN PATENT DOCUMENTS

| JP | 2009-219045 A | 9/2009 |
| JP | 2014-135624 A | 7/2014 |
| JP | 2020-092422 A | 6/2020 |
| WO | 2017/161303 A1 | 9/2017 |

OTHER PUBLICATIONS

Kapp, M., et al., "Investigation of GeO2 thin film properties for improvement of temperature coefficient of frequency of SAW devices", 2014 European Frequency and Time Forum (EFTF), Jun. 2014, 4 pages.

Solal et al., "A method to reduce losses in buried electrodes RF SAW resonators", 2011 IEEE International Ultrasonics Symposium, pp. 324-332, doi: 10.1109/ULTSYM.2011.0078.

* cited by examiner

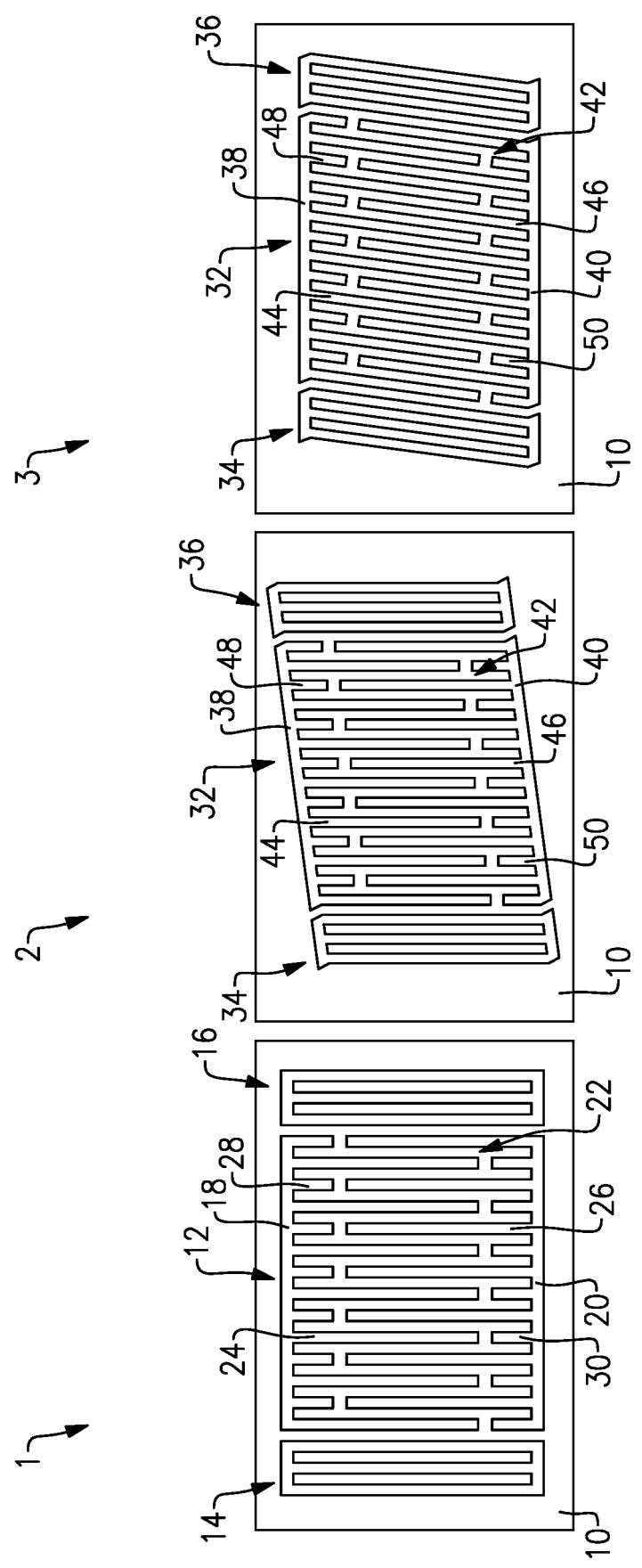

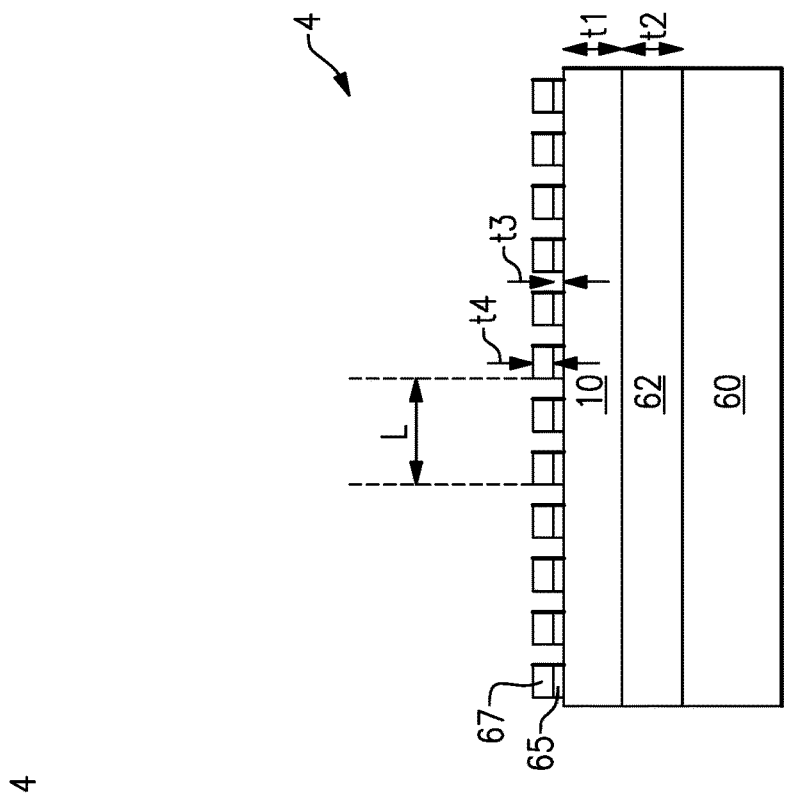
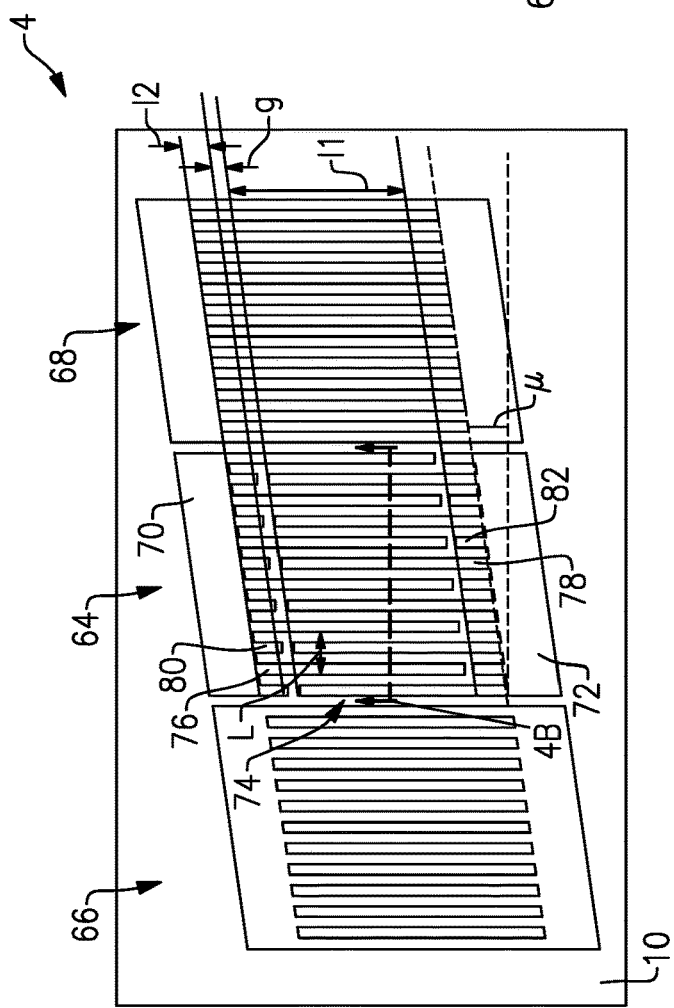

μ=8deg

μ=16deg

ACOUSTIC WAVE DEVICE WITH TILTED MULTILAYER INTERDIGITAL TRANSDUCER ELECTRODE

CROSS REFERENCE TO PRIORITY APPLICATION

This application claims the benefit of priority of U.S. Provisional Patent Application No. 63/294,806, filed Dec. 29, 2021 and titled "ACOUSTIC WAVE DEVICE WITH TILTED MULTILAYER INTERDIGITAL TRANSDUCER ELECTRODE," the disclosures of which are hereby incorporated by reference in their entirety herein.

BACKGROUND

Technical Field

Embodiments of this disclosure relate to acoustic wave devices.

Description of Related Technology

Acoustic wave filters can be implemented in radio frequency electronic systems. For instance, filters in a radio frequency front end of a mobile phone can include acoustic wave filters. An acoustic wave filter can filter a radio frequency signal. An acoustic wave filter can be a band pass filter. A plurality of acoustic wave filters can be arranged as a multiplexer. For example, two acoustic wave filters can be arranged as a duplexer.

An acoustic wave filter can include a plurality of resonators arranged to filter a radio frequency signal. Example acoustic wave filters include surface acoustic wave (SAW) filters and bulk acoustic wave (BAW) filters. A surface acoustic wave resonator can include an interdigital transductor electrode on a piezoelectric substrate. The surface acoustic wave resonator can generate a surface acoustic wave on a surface of the piezoelectric layer on which the interdigital transductor electrode is disposed.

SUMMARY

In one aspect, an acoustic wave device is disclosed. The acoustic wave device can include a multilayer piezoelectric substrate and an interdigital transducer electrode over the multilayer piezoelectric substrate. The interdigital transducer electrode includes a first layer and a second layer over the first layer. The interdigital transducer electrode has a tilt angle of at least 12 degrees. The acoustic wave device being configured to generate a surface acoustic wave having a wavelength L.

In one embodiment, the multilayer piezoelectric substrate includes a support substrate, a piezoelectric layer over the support substrate, and an intermediate layer between the support substrate and the piezoelectric layer.

In one embodiment, the first layer of the interdigital transducer electrode has a density greater than the second layer of the interdigital transducer electrode. The first layer includes molybdenum and the second layer can include aluminum. The first layer can have a thickness less than 0.05 L. The second layer can have a thickness in a range between 0.03 L and 0.1 L.

In one embodiment, the tilt angle of the interdigital transducer electrode is in a range between 12 degrees and 20 degrees.

In one embodiment, the interdigital transducer electrode has a non-zero rotation angle. The non-zero rotation angle can have a negative value of the tilt angle.

In one embodiment, the interdigital transducer electrode includes a first bus bar, a second bus bar, a first set of fingers extending from the first bus bar, and a second set of fingers extending from the second bus bar. A total number of the fingers can be between 50 L and 100 L, and a width between a finger to an adjacent finger can be in a range between 20 L to 40 L.

In one embodiment, the interdigital transducer electrode includes dummy fingers.

In one embodiment, the acoustic wave device further includes a pair of reflectors over the multilayer piezoelectric substrate. The interdigital transducer electrode can be positioned longitudinally between the pair of reflectors. A pitch of the interdigital transducer electrode can be different than a pitch of the pair of reflectors.

In one embodiment, fingers of the interdigital transducer electrode have varying pitches.

In one aspect, a multilayer piezoelectric substrate surface acoustic wave device is disclosed. The acoustic wave device can include a piezoelectric layer and an interdigital transducer electrode over the piezoelectric layer. The interdigital transducer electrode includes a first layer and a second layer over the first layer. The interdigital transducer electrode has a non-zero tilt angle and a non-zero rotation angle. The non-zero tilt angle is configured to suppress spurious responses. The acoustic wave device is configured to generate a surface acoustic wave having a wavelength L.

In one aspect, the tilt angle being at least 12 degrees. The first layer can include molybdenum and the second layer can include aluminum.

In one aspect, an acoustic wave device is disclosed. The acoustic wave device can include a multilayer piezoelectric substrate and an interdigital transducer electrode over the multilayer piezoelectric substrate. The interdigital transducer electrode includes a first layer and a second layer over the first layer. The first layer is more dense than the second layer. The interdigital transducer electrode has a non-zero tilt angle. The acoustic wave device is configured to generate a surface acoustic wave having a wavelength L. The first layer has a thickness less than 0.05 L and the second layer has a thickness in a range between 0.03 L and 0.1 L.

In one aspect, the tilt angle is at least 12 degrees.

In one aspect, the interdigital transducer electrode has a non-zero rotation angle.

In one aspect, an acoustic wave device is disclosed. The acoustic wave device can include a multilayer piezoelectric substrate and an interdigital transducer electrode over the multilayer piezoelectric substrate. The interdigital transducer electrode includes a first layer and a second layer over the first layer. The interdigital transducer electrode has a non-zero tilt angle that provides an improved quality factor as compared to a zero tilt angle. The acoustic wave device is configured to generate a surface acoustic wave that has a wavelength L. A total number of fingers of the interdigital transducer electrode is between 50 L and 100 L, and a width between a finger of the interdigital transducer electrode and an adjacent finger of interdigital transducer electrode is between 20 L and 40 L.

In one aspect, the multilayer piezoelectric substrate includes a support substrate, a piezoelectric layer over the support substrate, and an intermediate layer between the support substrate and the piezoelectric layer.

In one aspect, the tilt angle is at least 12 degrees.

In one aspect, the interdigital transducer electrode includes dummy fingers.

In one aspect, the first layer of the interdigital transducer electrode has a density greater than the second layer of the interdigital transducer electrode. The first layer can include molybdenum and the second layer includes aluminum. The first layer can have a thickness less than 0.05 L. The second layer can have a thickness in a range between 0.03 L and 0.1 L.

In one aspect, the tilt angle of the interdigital transducer electrode is in a range between 12 degrees and 20 degrees.

In one aspect, the interdigital transducer electrode has a non-zero rotation angle. The non-zero rotation angle can have a negative value of the tilt angle.

In one aspect, an acoustic wave device is disclosed. The acoustic wave deice can include a multilayer piezoelectric substrate and an interdigital transducer electrode over the multilayer piezoelectric substrate. The interdigital transducer electrode includes a first layer and a second layer over the first layer. The first layer is more dense than the second layer. The interdigital transducer electrode has a non-zero tilt angle. The acoustic wave device is configured to generate a surface acoustic wave having a wavelength L. A total number of fingers of the interdigital transducer electrode is between 50 L and 100 L, and a width between a finger of the interdigital transducer electrode and an adjacent finger of interdigital transducer electrode is between 20 L and 40 L.

In one embodiment, the tilt angle is at least 12 degrees. The tilt angle of the interdigital transducer electrode can be in a range between 12 degrees and 20 degrees.

In one embodiment, the interdigital transducer electrode has a non-zero rotation angle.

In one aspect, an acoustic wave device is disclosed. The acoustic wave device can include a support substrate, a piezoelectric layer over the support substrate, and an interdigital transducer electrode formed with the piezoelectric layer. The interdigital transducer electrode includes a first layer and a second layer. The first layer is more dense than the second layer. The interdigital transducer electrode has a non-zero tilt angle and a non-zero rotation angle. The non-zero rotation angle is a negative value of the non-zero tilt angle. The acoustic wave device is configured to generate a surface acoustic wave that has a wavelength L. A total number of fingers of the interdigital transducer electrode is between 50 L and 100 L, and a width between a finger of the interdigital transducer electrode and an adjacent finger of interdigital transducer electrode is between 20 L and 40 L.

In one embodiment, the tilt angle is at least 12 degrees. The tilt angle of the interdigital transducer electrode can be in a range between 12 degrees and 20 degrees.

In one embodiment, the interdigital transducer electrode is formed over the piezoelectric layer.

In one embodiment, the second layer over the first layer.

The present disclosure relates to U.S. Patent Application No.

The present disclosure relates to U.S. patent application Ser. No. 18/145,347, titled "MULTILAYER PIEZOELECTRIC SUBSTRATE SURFACE ACOUSTIC WAVE EVICE WITH TILTED MULTILAYER INTERDIGITAL TRANSDUCER ELECTRODE," filed on even date herewith filed on even date herewith, the entire disclosure of which are hereby incorporated by reference herein.

BRIEF DESCRIPTION OF THE DRAWINGS

Embodiments of this disclosure will now be described, by way of non-limiting example, with reference to the accompanying drawings.

FIG. 1 shows a top layout view of a surface acoustic wave (SAW) resonator.

FIG. 2 shows a top layout view of another SAW resonator.

FIG. 3 shows a top layout view of another SAW resonator.

FIG. 4A is a schematic top plan view of a SAW resonator according to an embodiment.

FIG. 4B is a schematic cross-sectional side view of a portion of the SAW resonator illustrated in FIG. 4A.

DETAILED DESCRIPTION OF CERTAIN EMBODIMENTS

Figure 5A:
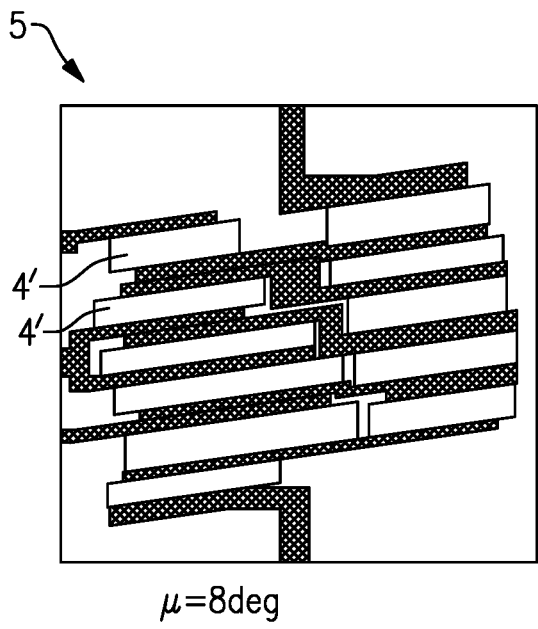
FIG. 5A is a top plan view of a chip that includes a plurality of tilted acoustic resonators.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Acoustic wave filters can filter radio frequency (RF) signals in a variety of applications, such as in an RF front end of a mobile phone. An acoustic wave filter can be implemented with surface acoustic wave (SAW) devices. SAW devices include SAW resonators, SAW delay lines, ladder filters, and multi-mode SAW (MMS) filters (e.g., double mode SAW (DMS) filters). A SAW resonator can be configured to generate, for example, a Rayleigh mode surface acoustic wave or a shear horizontal mode surface acoustic wave. Although embodiments may be discussed with reference to SAW resonators, any suitable principles and advantages disclosed herein can be implemented in any suitable SAW devices. In general, high quality factor (Q), large effective electromechanical coupling coefficient ($k^2$), high frequency ability, and spurious free response can be significant aspects for micro resonators to enable low-loss filters, stable oscillators, and sensitive sensors.

SAW resonators can include a multilayer piezoelectric substrate. Multi-layer piezoelectric substrates can provide good thermal dissipation characteristics and improved temperature coefficient of frequency (TCF) relative to certain single layer piezoelectric substrates. For example, certain SAW resonators with a piezoelectric layer on a high impedance layer, such as silicon, can achieve a better temperature coefficient of frequency (TCF) and thermal dissipation compared to similar devices without the high impedance layer. A better TCF can contribute to obtaining the large effective electromechanical coupling coefficient ($k^2$). Various embodiments of SAW devices disclosed herein can have a multilayer piezoelectric substrate (MPS) structure.

SAW resonators can have a relatively strong transverse mode in and/or near a pass band. The presence of the relatively strong transverse modes can hinder the accuracy and/or stability of oscillators and sensors, as well as hurt the performance of acoustic wave filters by creating relatively severe passband ripples and possibly limiting the rejection. Therefore, transverse mode suppression can be significant for SAW resonators.

Tilted single layer interdigital transducer (IDT) electrodes can be used to suppress spurious responses (e.g., a transverse mode spurious) in multi-layer piezoelectric substrate (MPS) SAW resonators. However, the tilted single layer IDT electrodes can take up more area or space on a surface of a piezoelectric layer as compared to IDT electrodes that are not tilted. This disclosure provides a technical solution to reduce the area for the titled IDT electrodes while maintaining the benefits of the tilted IDT electrodes. Various embodiments disclosed herein utilize a multilayer IDT electrode with an optimal tilt angle that can reduce the area needed for the IDT electrodes. Various embodiments disclosed herein can also utilize the multilayer IDT electrode with optimal tilt and rotation angles that can further reduce the area needed for the IDT electrodes.

Embodiments of SAW resonators disclosed herein include an interdigital transducer (IDT) electrode that has a rotation angle and a tilt angle. The rotation angle refers to a third Euler angle $\psi$ of Euler angles ($\varphi$, $\theta$, $\psi$) of the crystal orientation of a carrier or substrate (e.g., a piezoelectric layer). An IDT electrode includes bus bars and fingers extending from the bus bars. A SAW resonator with the rotation angle ($\psi$) of 0° and the tilt angle ($\mu$) of 0° has a horizontal reference axis that is in parallel with a wave propagation direction of the SAW resonator (e.g., a crystal reference). The SAW resonator also has a vertical reference axis that is in parallel with a longitudinal direction of a finger of the IDT electrode when the SAW resonator has a rotation angle ($\psi$) of 0° and the tilt angle ($\mu$) of 0°. Therefore, the rotation angle ($\psi$) can also refer to an angle of the entire IDT electrode structure (the fingers and the bus bar) relative to the horizontal reference axis of the SAW resonator. The tilt angle ($\mu$) refers to an angle of the bus bar relative to the horizontal reference axis of wave propagation in the SAW resonator while the fingers of the IDT electrode are parallel to the vertical reference axis.

In a final product, first and second sides of a chip that includes a SAW resonator with the rotation angle ($\psi$) of 0° and the tilt angle ($\mu$) of 0° can extend parallel with a bus bar of the SAW resonator, and third and fourth sides of the chip that extends perpendicular to the first and second sides can extend parallel with fingers of the SAW resonator. In a final product, first and second sides of a chip that includes a SAW resonator with the rotation angle ($\psi$) of 0° and the tilt angle ($\mu$) of non-zero can extend non-parallel with a bus bar of the SAW resonator, and third and fourth sides of the chip that extends perpendicular to the first and second sides can extend parallel with fingers of the SAW resonator. In a final product, first and second sides of a chip that includes a SAW resonator with the rotation angle ($\psi$) of x° (x being non-zero) and the tilt angle ($\mu$) of –x° can extend parallel with a bus bar of the SAW resonator, and third and fourth sides of the chip that extends perpendicular to the first and second sides can extend non-parallel with fingers of the SAW resonator.

FIG. 1 shows a top layout view of a SAW resonator 1. The SAW resonator 1 includes a piezoelectric layer 10, and an interdigital transducer electrode (IDT) electrode 12 and a pair of reflectors 14, 16 over the piezoelectric layer 10. The IDT electrode 12 of the SAW resonator 1 includes a first bus bar 18, a second bus bar 20, and a finger region 22 between the first bus bar 18 and the second bus bar 20.

The finger region 22 includes first fingers 24 that extend from the first bus bar 18 and second fingers 26 that extend from the second bus bar 20. The finger region 22 includes first dummy fingers 28 that extend from the first bus bar 18 and second dummy fingers 30 that extend from the second bus bar 20. The first and second dummy fingers 28, 30 are shorter than the first and second fingers 24, 26. The first and second dummy fingers 28, 30 can function as pseudo-electrodes for preventing or mitigating interference with the propagation of a wave generated by the first and second fingers 24, 26. The IDT electrode 12 has a first pitch P1 (an IDT pitch) and the reflectors 14, 16 have a second pitch P2 (a reflector pitch).

The first bus bar 18 and the second bus bar 20 extend in parallel along a horizontal axis x. The first fingers 24 and the second fingers 26 extend along a vertical axis y that is perpendicular to the horizontal axis x. A third Euler angle ψ of Euler angles (φ, θ, ψ) of the crystal orientation of piezoelectric layer 10 is set to 0°. Therefore, the illustrated IDT electrode 12 of the SAW resonator 1 has a rotation angle r of 0° and a tilt angle μ of 0°.

FIG. 2 shows a top layout view of a SAW resonator 2. FIGS. 1 and 2 are illustrated along the same horizontal axis and with parallel vertical axes. The SAW resonator 2 includes a piezoelectric layer 10, and an IDT electrode 32 and a pair of reflectors 34, 36 over the piezoelectric layer 10. The IDT electrode 32 of the SAW resonator 2 includes a first bus bar 38, a second bus bar 40, and a finger region 42.

The finger region 42 includes first fingers 44 that extend from the first bus bar 38 and second fingers 46 that extend from the second bus bar 40. The finger region 42 includes first dummy fingers 48 that extend from the first bus bar 38. The finger region 42 also includes second dummy fingers 50 that extend from the second bus bar 40. The IDT electrode 32 has a first pitch P1 (an IDT pitch) and the reflectors 34, 36 have a second pitch P2 (a reflector pitch).

The IDT electrode 32 of the SAW resonator 2 is tilted relative to the IDT electrode 12 of the SAW resonator 1. The IDT electrode 32 of the SAW resonator 2 has a tilt angle μ. The illustrated IDT electrode 32 has the tilt angle μ of non-zero. The first fingers 44 and the second fingers 46 extend along the vertical axis y. A third Euler angle ψ of Euler angles (φ, θ, ψ) of the crystal orientation of piezoelectric layer 10 is set to 0°. Therefore, the illustrated IDT electrode 32 of the SAW resonator 2 has a rotation angle r of 0° and the tilt angle μ of non-zero. In some embodiments, the tilt angle μ can be about 8°. For example, the tilt angle μ can be between 5° to 15°. The IDT electrode 32 of the SAW resonator 2 is oriented on the piezoelectric layer 10 such that the acoustic propagation direction is along the horizontal axis z.

FIG. 3 shows a top layout view of a SAW resonator 3. FIGS. 1 to 3 are illustrated along the same horizontal axis and with parallel vertical axes. The SAW resonator 3 includes a piezoelectric layer 10, and an IDT electrode 32 and a pair of reflectors 34, 36 over the piezoelectric layer 10. The IDT electrode 32 of the SAW resonator 3 includes a first bus bar 38, a second bus bar 40, and a finger region 42. The SAW resonator 3 is generally similar to the SAW resonator 2 except that the IDT electrode 32 of the SAW resonator 3 is oriented on the piezoelectric layer 10 such that the first bus bar 38 and the second bus bar 40 extend along the horizontal axis x, and the fingers 44, 46 extends non-parallel with the vertical axis y. Therefore, the illustrated IDT electrode 32 of the SAW resonator 3 has a rotation angle r of non-zero and the tilt angle μ of non-zero. The orientation of the IDT electrode 32 and the pair of reflectors 34, 36 of the SAW resonator 3 helps reduce an area on the piezoelectric layer 10 needed for the IDT electrode 32 and the pair of reflectors 34, 36. The IDT electrode 32 of the SAW resonator 3 is oriented on the piezoelectric layer 10 such that the acoustic propagation direction is angled relative to the horizontal axis z by the tilt angle μ of non-zero.

FIG. 4A is a schematic top plan view of a SAW resonator 4 according to an embodiment. FIG. 4B is a schematic cross-sectional side view of a portion of the SAW resonator 4 illustrated in FIG. 4A. The SAW resonator 4 can include a support substrate 60, a piezoelectric layer 10 over the support substrate 60, an intermediate layer 62 between the support substrate 60 and the piezoelectric layer 10, and an IDT electrode 64 and a pair of reflectors 66, 68 formed with the piezoelectric layer 10. For example, as illustrated, the IDT electrode 64 and a pair of reflectors 66, 68 can be formed over the piezoelectric layer 10. In some other embodiments, the IDT electrode 64 and/or the pair of reflectors 66, 68 can be at least partially embedded in the piezoelectric layer 10. The IDT electrode 64 of the SAW resonator 4 can include a first bus bar 70, a second bus bar 72, and a finger region 74.

The finger region 74 includes first fingers 76 that extend from the first bus bar 70 and second fingers 78 that extend from the second bus bar 72. The finger region 74 includes first dummy fingers 80 that extend from the first bus bar 70. The finger region 74 also includes second dummy fingers 82 that extend from the second bus bar 72. The IDT electrode 64 has a first pitch (an IDT pitch) and the reflectors 66, 68 have a second pitch (a reflector pitch). In some embodiments, the first pitch and the second pitch can be different. The first pitch can set the wavelength λ or L of the SAW resonator 4.

The IDT electrode 64 of the SAW resonator 4 is tilted relative to the IDT electrode 12 of the SAW resonator 1 illustrated in FIG. 1. The IDT electrode 64 of the SAW resonator 4 has a tilt angle μ. The illustrated IDT electrode 64 has the tilt angle μ of non-zero. The first fingers 76 and the second fingers 78 extend along the vertical axis y. A third Euler angle ψ of Euler angles (φ, θ, ψ) of the crystal orientation of piezoelectric layer 10 is set to 0°. Therefore, the illustrated IDT electrode 64 of the SAW resonator 4 has a rotation angle r of 0° and the tilt angle μ of non-zero. In some embodiments, the tilt angle μ can be at least 12°. For example, the tilt angle μ can be between 12° and 20° or 14° and 18°. The IDT electrode 64 of the SAW resonator 4 is oriented on the piezoelectric layer 10 such that the acoustic propagation direction is along the horizontal axis z.

The IDT electrode 64 of the SAW resonator 4 includes a first layer 65 and a second layer 67. The first layer 65 can be positioned on the piezoelectric layer 10 and the second layer 67 can be positioned on the first layer 65. The first layer 65 and the second layer 67 can have different densities. In some embodiments, the first layer 65 has a density that is greater than a density of the second layer 67. For example, the first layer 65 can be a molybdenum (Mo) layer and the second layer 67 can be an aluminum (Al) layer. The IDT electrode 64 can include any other suitable IDT electrode material(s). For example, an IDT electrode can include one or more of an aluminum (Al) layer, a molybdenum (Mo) layer, a tungsten (W) layer, a titanium (Ti) layer, a platinum (Pt) layer, a gold (Au) layer, a silver (Ag) layer, copper (Cu) layer, a Magnesium (Mg) layer, a ruthenium (Ru) layer, or the like. The IDT electrode may include alloys, such as AlMgCu, AlCu, etc. As compared to a single layer IDT electrode, multilayer IDT electrode with a layer having more dense material than the material of the single layer IDT, the multilayer IDT can be made smaller than the single layer IDT, because the same weight can be provided by a less volume with the more dense material.

The piezoelectric layer 10 can be a lithium tantalate (LT) layer. For example, the piezoelectric layer 10 can be an LT layer having a cut angle R° rotated Y-cut X propagation LiTaO3 (R°YX-LT) in a range between 20° and 60°, such as 42°. The cut angle of the piezoelectric layer 10 can be expressed in Euler angle and the cut angle can be, for example, 110°<θ<150°. Any other suitable piezoelectric material, such as a lithium niobate (LN) layer, can be used as the piezoelectric layer 10.

The support substrate 60 can be a silicon substrate, a quartz substrate, a sapphire substrate, a polycrystalline spinel substrate, a ceramic substrate, a diamond substrate, aluminum nitrite substrate, or any other suitable carrier substrate. In some embodiments, the intermediate layer 62 can act as an adhesive layer. The intermediate layer 62 can include any suitable material. The intermediate layer 62 can be, for example, an oxide layer (e.g., a silicon dioxide ($SiO_2$) layer).

Referring to FIG. 4A, the IDT electrode 64 can have a center region and the first fingers 76 and the second fingers 78 have length l1 in the center region. In some embodiments, the length of the first fingers 76 or the second fingers 78 in the center region can be in a range between 10 L and 40 L. The first dummy finger 68 and the second dummy finger 82 can have a length l2. In some embodiments, the length l2 of the first dummy finger 68 and the second dummy finger 82 can be in a range between 0.5 L and 2.5 L. The IDT electrode 64 has a gap g between a dummy finger (the first dummy finger 68 or the second dummy finger 82) that extends from a bus bar 72, 80 and a corresponding finger (the first fingers 76 or the second fingers 78) that extends from the opposing bus bar 72, 80. In some embodiments, the gap g can be in a range between 0.05 L and 0.5 L.

Referring to FIG. 4B, the piezoelectric layer 10 has a thickness t1. In some embodiments, the thickness t1 of the piezoelectric layer 10 can be in a range between 0.1 L and 0.3 L. The intermediate layer 62 has a thickness t2. In some embodiments, the thickness t2 of the intermediate layer 62 can be in a range between 0.1 L and 0.3 L. The first layer 65 of the IDT electrode 64 has a thickness t3, and the second layer 67 of the IDT electrode 64 has a thickness t4. In some embodiments, the thickness t3 of the first layer 65 can be in a range between 0.01 L and 0.05 L. In some embodiments, the thickness t4 of the second layer 67 can be in a range between 0.03 L and 0.1 L, or 0.03 L and 0.075 L.

Figure 5B:
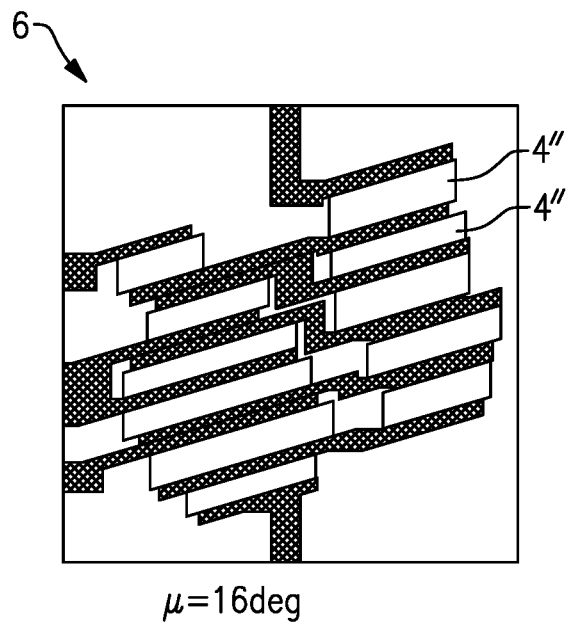
FIG. 5B is a top plan view of chip that includes a plurality of tilted acoustic resonators, according to an embodiment.

FIGS. 5A and 5B are top plan views of chips 5, 6 that include a plurality of tilted acoustic resonators 4', 4". Each of the plurality of tilted acoustic resonators 4', 4" can include a structure similar to that of the SAW resonator 4 shown in FIGS. 4A and 4B. In FIG. 5A, the plurality of tilted acoustic resonators 4' have a tilt angle μ of 8 degrees. In FIG. 5B, the plurality of tilted acoustic resonators 4" have a tilt angle μ of 16 degrees.

Figure 6:
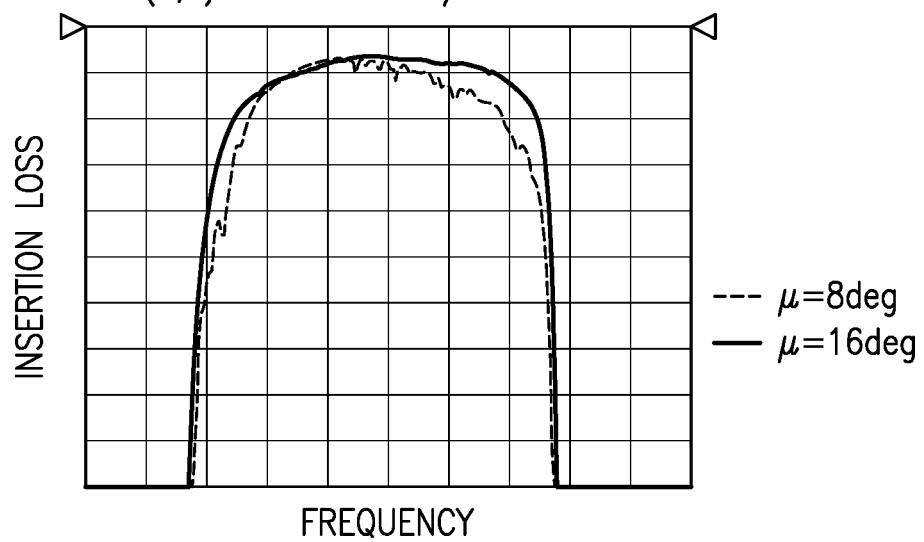
FIG. 6 is a graph showing measurement results of the chips of FIGS. 5A and 5B.

FIG. 6 is a graph showing measurement results (electrical performances) of the chips 5, 6. The graph shows frequency in the x-axis and insertion loss in the y-axis. The measurement results indicate that the chip 6 that includes the plurality of tilted acoustic resonators 4" with the tilt angle μ of 16 degrees has a better, cleaner electrical performance than the chip 5 that includes the plurality of tilted acoustic resonators 4' with the tilt angle μ of 8 degrees.

Figure 7:
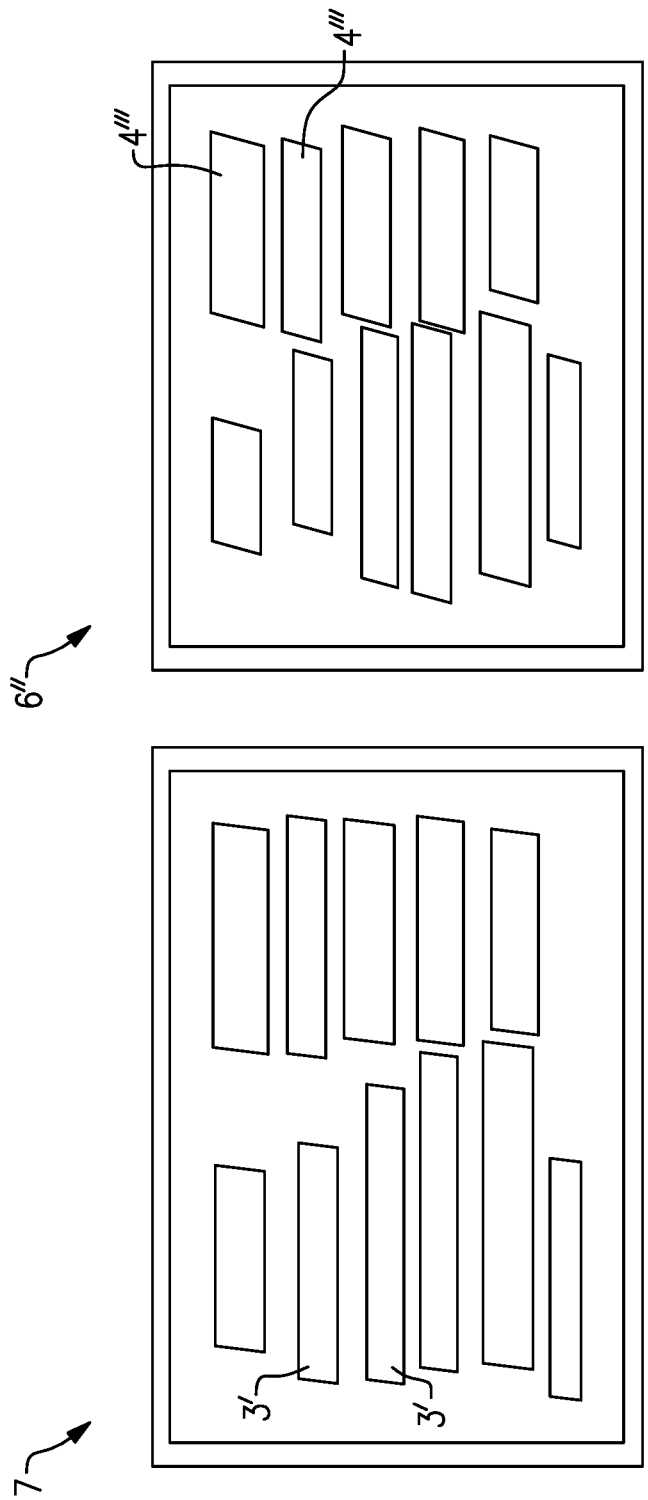
FIG. 7A is a top plan view of a chip that includes a plurality of acoustic resonators.
FIG. 7B is a top plan view of a chip that includes a plurality of acoustic resonators, according to an embodiment.

FIGS. 7A and 7B are top plan views of chips 7, 6" that include a plurality of acoustic resonators 3', 4'''. Each of the plurality of acoustic resonators 3' can include a structure similar to that of the SAW resonator 3 shown in FIG. 3. The plurality of acoustic resonators 3' each includes single layer IDT electrodes that have a tilt angle of 8 degrees and a rotation angle of 8 degrees. The single layer IDT electrodes of the plurality of acoustic resonators 3' include an aluminum layer. Each of the plurality of acoustic resonators 4''' can include a structure similar to that of the SAW resonator 4 shown in FIGS. 4A and 4B. The plurality of acoustic resonators 4''' each includes multilayer IDT electrodes that have a tilt angle of 16 degrees and a rotation angle of 16 degrees. The multilayer IDT electrodes of the plurality of acoustic resonators 4''' include a molybdenum layer and an aluminum layer. FIGS. 7A and 7B illustrate that an area needed to arrange the same number of resonators on a chip can be reduced with the plurality of acoustic resonators 4''' as compared to the plurality of acoustic resonators 3'. As compared to the chip 7, the chip 6" can reduce the area needed to arrange the plurality of acoustic resonators 4''' by about 22%. This can be, at least in part, due to the use of molybdenum layer which has a higher density than the aluminum layer.

Figure 8:
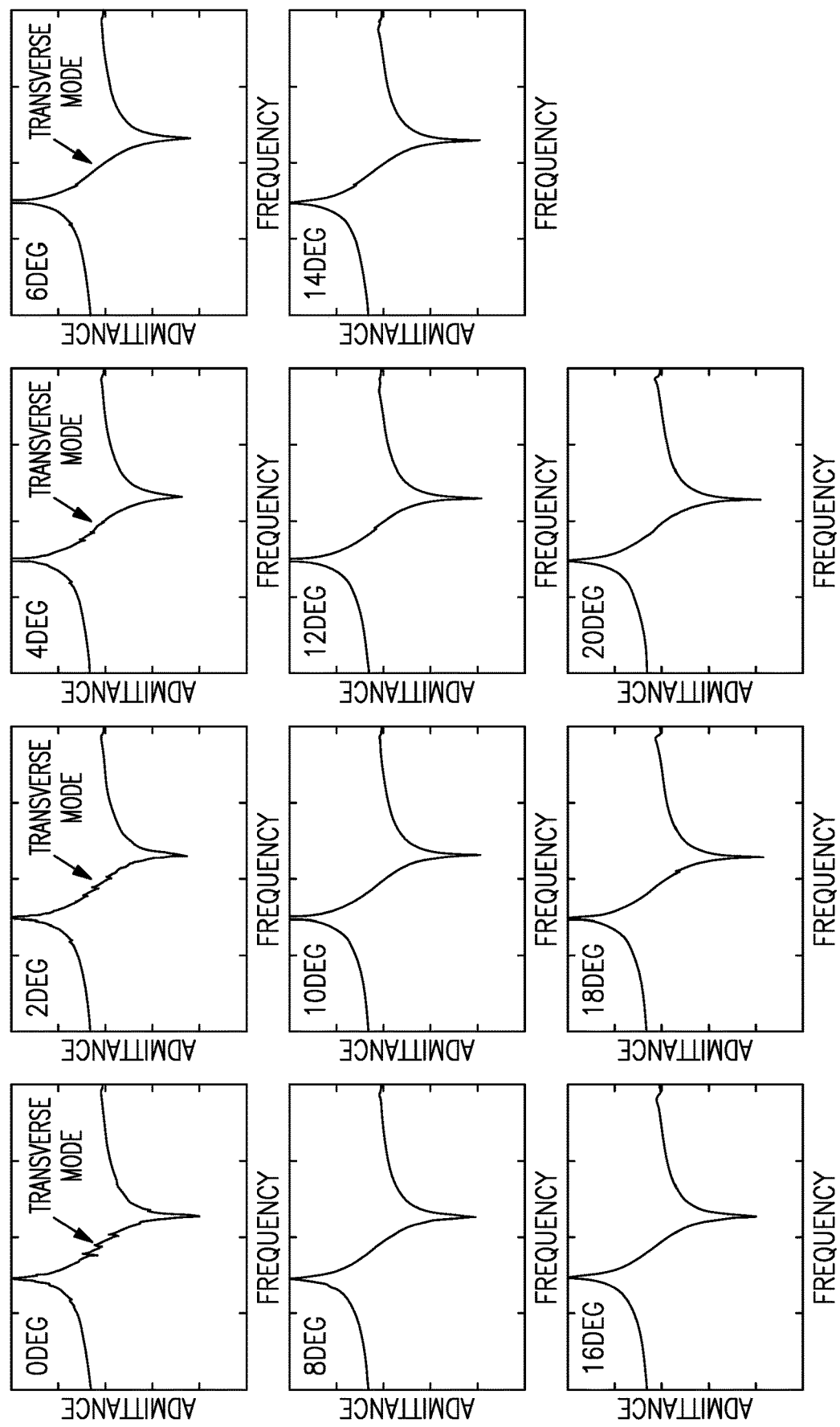
FIG. 8 includes graphs showing measured admittance of the SAW resonator of FIGS. 4A and 4B with various tilt angles.

FIG. 8 includes graphs showing measured admittance of the SAW resonator 4 illustrated in FIGS. 4A and 4B with various tilt angles from 0 degree to 20 degrees with 2 degree increments. The measurement results indicate that the transverse mode is suppressed when the tilt angle μ is about 8 degrees or more. Accordingly, when a multilayer IDT electrode is used as in the SAW resonator 4, it can be advantageous to tilt the multilayer IDT electrode 8 degrees or more. For example, to suppress the transverse mode, it can be advantageous for the multilayer IDT electrode to have a tilt angle in a range between 8 degrees and 20 degrees, 10 degrees and 20 degrees, 8 degrees and 18 degrees, or 10 degrees and 18 degrees.

Figure 9:
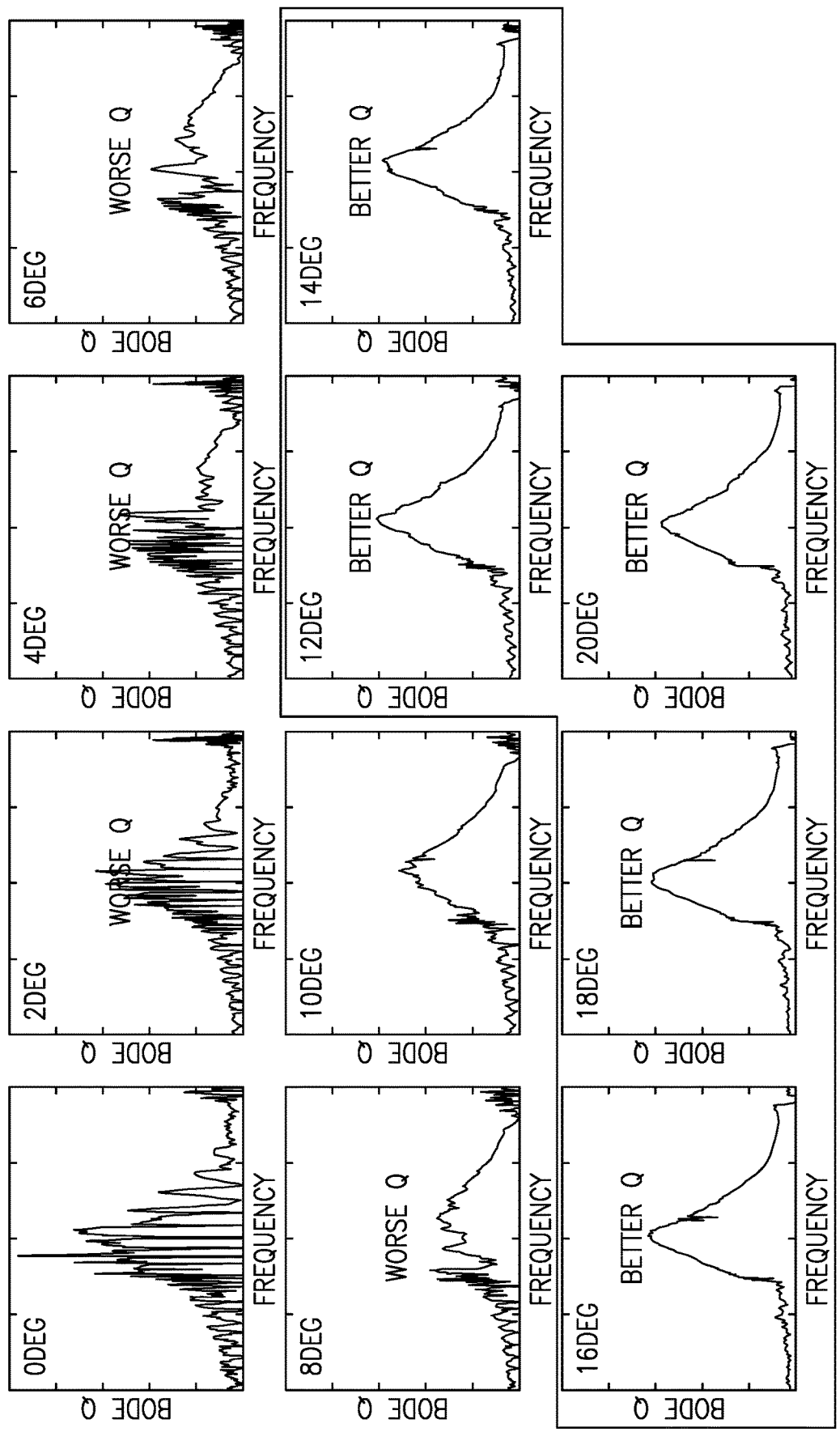
FIG. 9 includes graphs showing measured bode quality factors (Q) of the SAW resonator of FIGS. 4A and 4B with various tilt angles.

FIG. 9 includes graphs showing measured bode quality factors (Q) of the SAW resonator 4 illustrated in FIGS. 4A and 4B with various tilt angles from 0 degree to 20 degrees with 2 degree increments. The measurement results indicate that the Q is sufficiently high when the tilt angle μ is 12 degrees or more. Accordingly, when a multilayer IDT electrode is used as in the SAW resonator 4, it can be advantageous to tilt the multilayer IDT electrode 12 degrees or more. For example, to obtain a sufficiently high Q, it can be advantageous for the multilayer IDT electrode to have a tilt angle in a range between 12 degrees and 20 degrees, 14 degrees and 20 degrees, 12 degrees and 18 degrees, or 14 degrees and 18 degrees.

Figure 10:
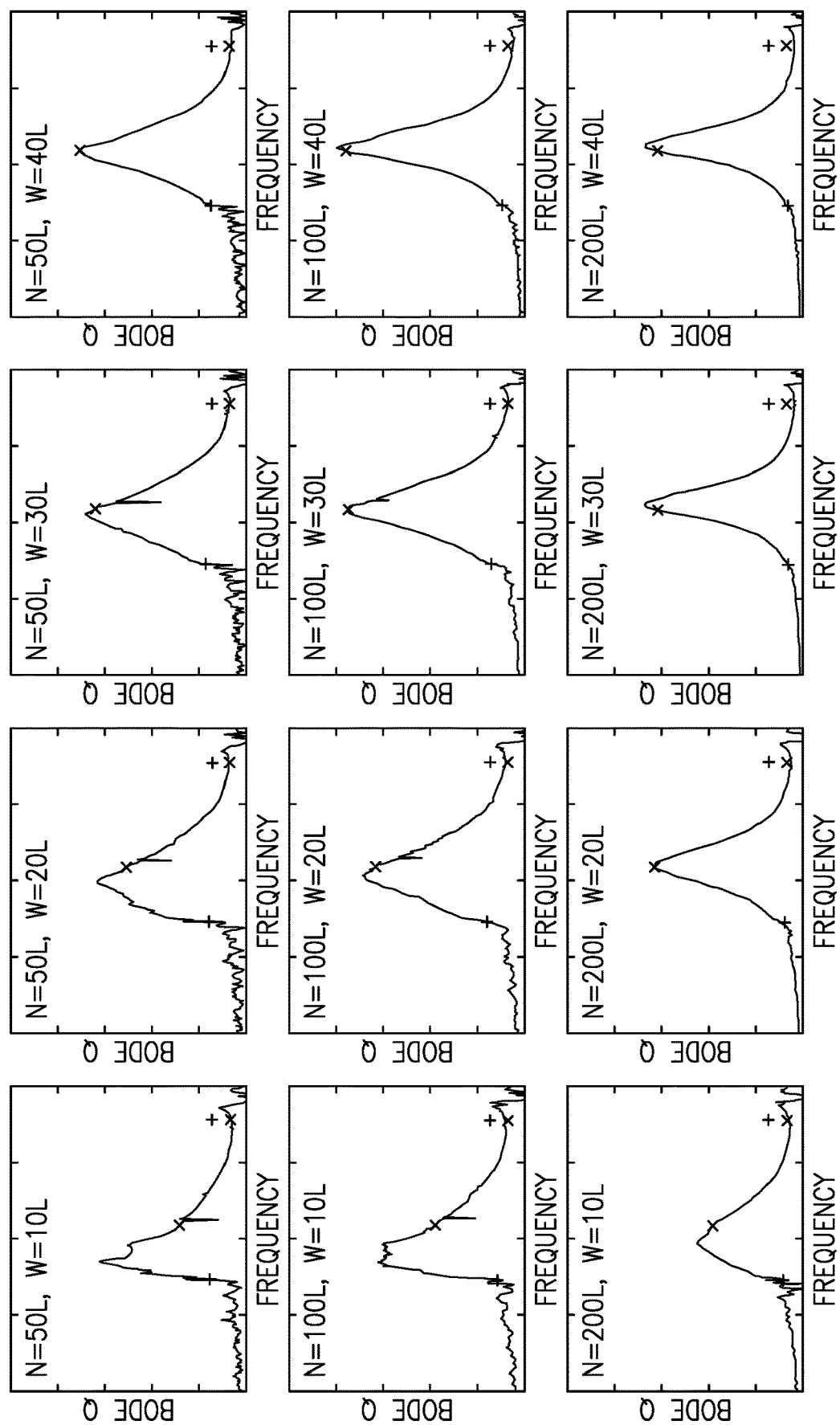
FIG. 10 includes graphs showing measured bode quality factors (Q) of the SAW resonator of FIGS. 4A and 4B with various total number of the fingers and various widths between a finger to an adjacent finger.

FIG. 10 includes graphs showing measured bode quality factors (Q) of the SAW resonator 4 illustrated in FIGS. 4A and 4B with various total number of the fingers and various widths between a finger to an adjacent finger. The measurement results indicate that the Q is sufficiently high when the total number of fingers is between 50 L and 100 L. The measurement results also indicate that the Q is sufficiently high when the width is between 20 L and 40 L. Accordingly, it can be advantageous for the multilayer IDT electrode of the SAW resonator 4 to have the total number of fingers in a range between 50 L and 100 L, 50 L and 80 L, or 70 L and 100 L, and to have a width in a range between 20 L and 40 L, 25 L and 40 L, 20 L and 35 L, or 25 L to 35 L.

Figure 11:
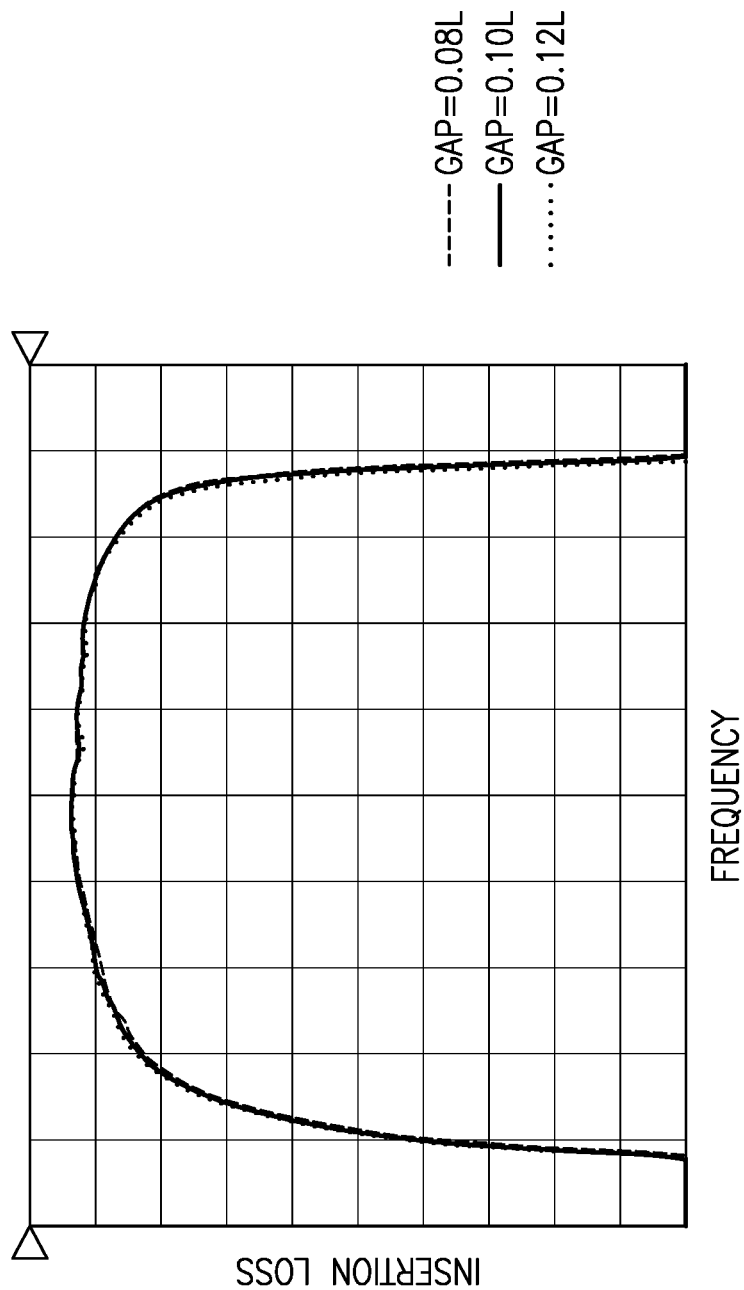
FIG. 11 is a graph showing measurement results of the SAW resonator of FIGS. 4A and 4B with various distances in a gap g between a dummy finger and a corresponding finger.

FIG. 11 is a graph showing measurement results (electrical performances) of the SAW resonator 4 illustrated in FIGS. 4A and 4B with various distances in the gap g between a dummy finger (the first dummy finger 68 or the second dummy finger 82) that extends from a bus bar 72, 80 and a corresponding finger (the first fingers 76 or the second fingers 78) that extends from the opposing bus bar 72, 80. The graph shows frequency in the x-axis and insertion loss in the y-axis. The measurement results indicate that there is no significant difference in the performance of the SAW resonator 4 between the gap g of 0.08 L, 0.1 L, and 0.12 L.

Figure 12:
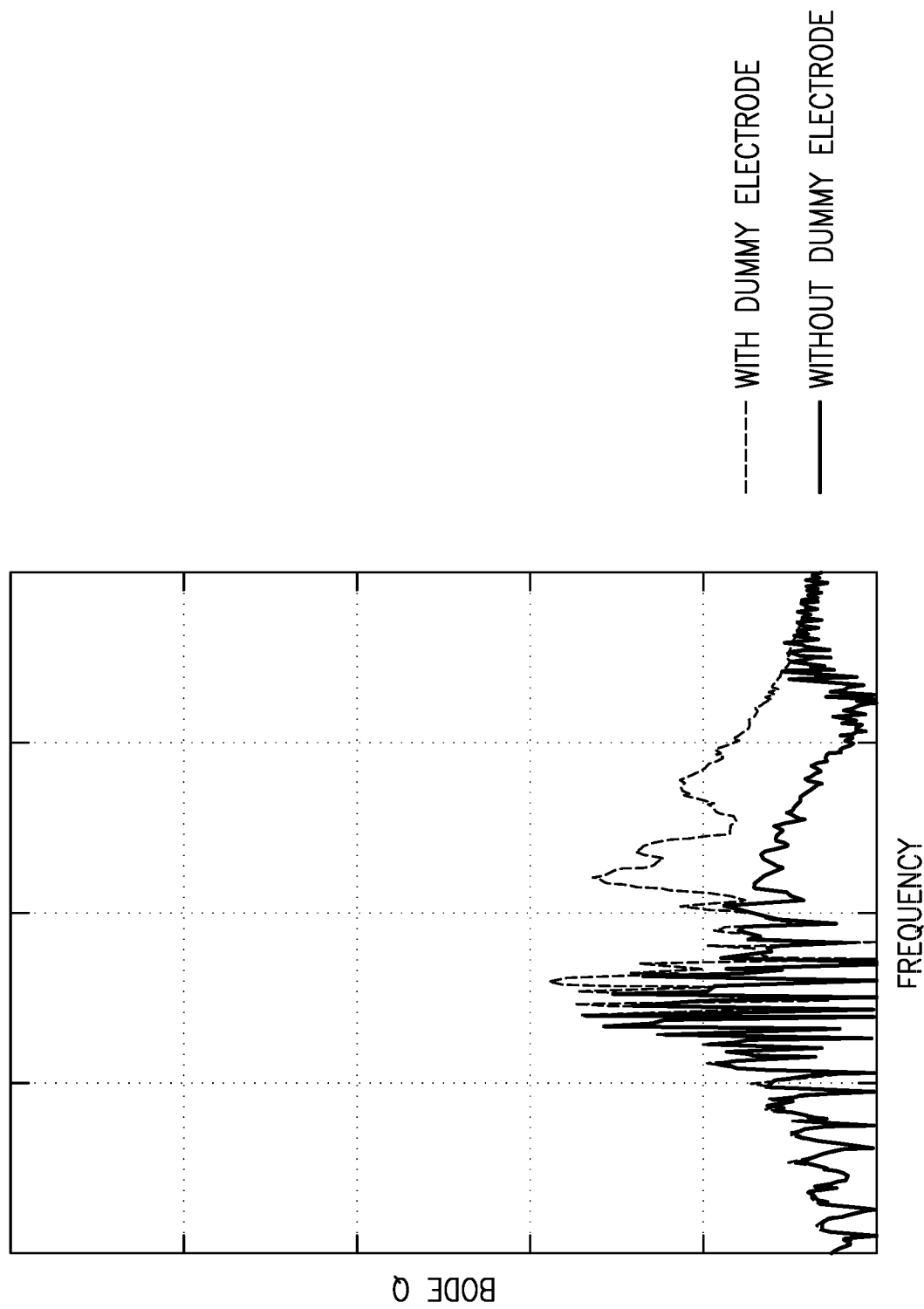
FIG. 12 is a graph showing measured bode quality factors (Q) of the SAW resonator of FIGS. 4A and 4B with and without the dummy fingers.

FIG. 12 is a graph showing measured bode quality factors (Q) of the SAW resonator 4 illustrated in FIGS. 4A and 4B with and without the dummy fingers (the first dummy finger 68 or the second dummy finger 82). The measurement results indicate that the Q is sufficiently high when there are dummy fingers. The measurement results indicate that the dummy fingers (the first dummy finger 68 or the second dummy finger 82) can improve the Q.

Figure 13B:
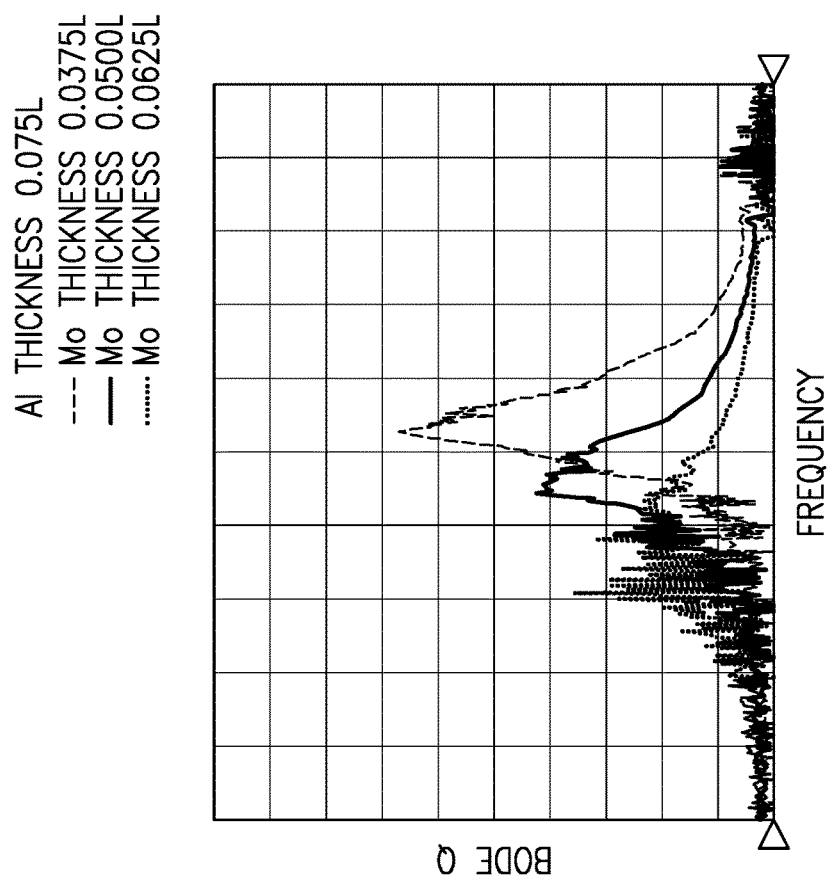
FIG. 13B is a graph showing measured bode quality factors (Q) of the SAW resonator of FIGS. 4A and 4B with various IDT thicknesses.
Figure 13A:
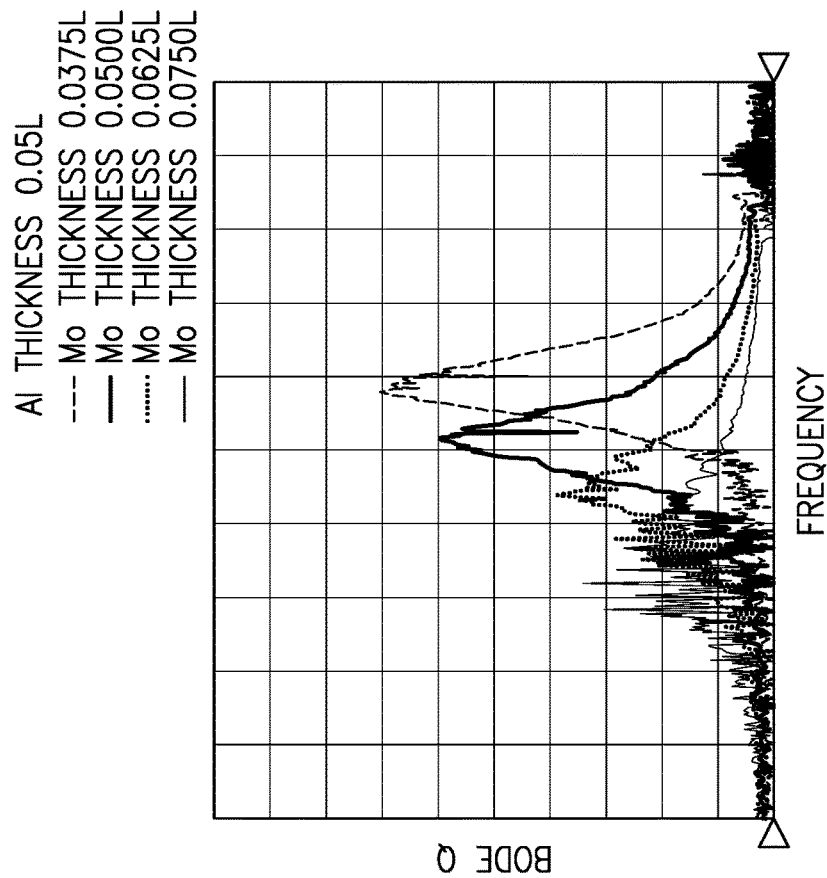
FIG. 13A is a graph showing measured bode quality factors (Q) of the SAW resonator of FIGS. 4A and 4B with various IDT thicknesses.

FIG. 13A is a graph showing measured bode quality factors (Q) of the SAW resonator 4 illustrated in FIGS. 4A and 4B with various IDT thicknesses. In the measurements, a molybdenum layer is used as the first layer 65 and an aluminum layer is used as the second layer 67 (see FIG. 4B). The aluminum layer is set to have the thickness t3 of 0.05 L. The measurements were taken for the thickness t4 of the molybdenum layer of 0.0375 L, 0.05 L, 0.0625 L, and 0.075 L.

FIG. 13B is a graph showing measured bode quality factors (Q) of the SAW resonator 4 illustrated in FIGS. 4A and 4B with various IDT thicknesses. In the measurements, a molybdenum layer is used as the first layer 65 and an aluminum layer is used as the second layer 67 (see FIG. 4B). The aluminum layer is set to have the thickness t3 of 0.075 L. The measurements were taken for the thickness t4 of the molybdenum layer of 0.0375 L, 0.05 L, and 0.0625 L.

The measurement results of FIGS. 13A and 13B indicate that the thicker the Molybdenum layer the lower the Q. The measurement results indicate that the Q is sufficiently high when the thickness t4 is less than 0.05 L. Based on these results, a skilled artisan can determine that an appropriate thickness t3 of the second layer 67, such as the aluminum layer, can be in a range between 0.03 L and 0.075 L (e.g., between 0.03 L and 0.06 L, 0.04 L and 0.075 L, or 0.04 L and 0.06 L) in certain embodiments.

Acoustic wave resonators disclosed herein can be included in a filter arranged to filter a radio frequency signal. One or more acoustic wave resonators including any suitable combination of features disclosed herein be included in a filter arranged to filter a radio frequency signal in a fifth generation (5G) New Radio (NR) operating band within Frequency Range 1 (FR1). A filter arranged to filter a radio frequency signal in a 5G NR operating band can include one or more SAW resonators disclosed herein. FR1 can be from 410 megahertz (MHz) to 7.125 gigahertz (GHz), for example, as specified in a current 5G NR specification. One or more acoustic wave resonators in accordance with any suitable principles and advantages disclosed herein can be included in a filter arranged to filter a radio frequency signal in a fourth generation (4G) Long Term Evolution (LTE) operating band. One or more acoustic wave resonators in accordance with any suitable principles and advantages disclosed herein can be included in a filter having a passband that includes a 4G LTE operating band and a 5G NR operating band.

Figure 14:
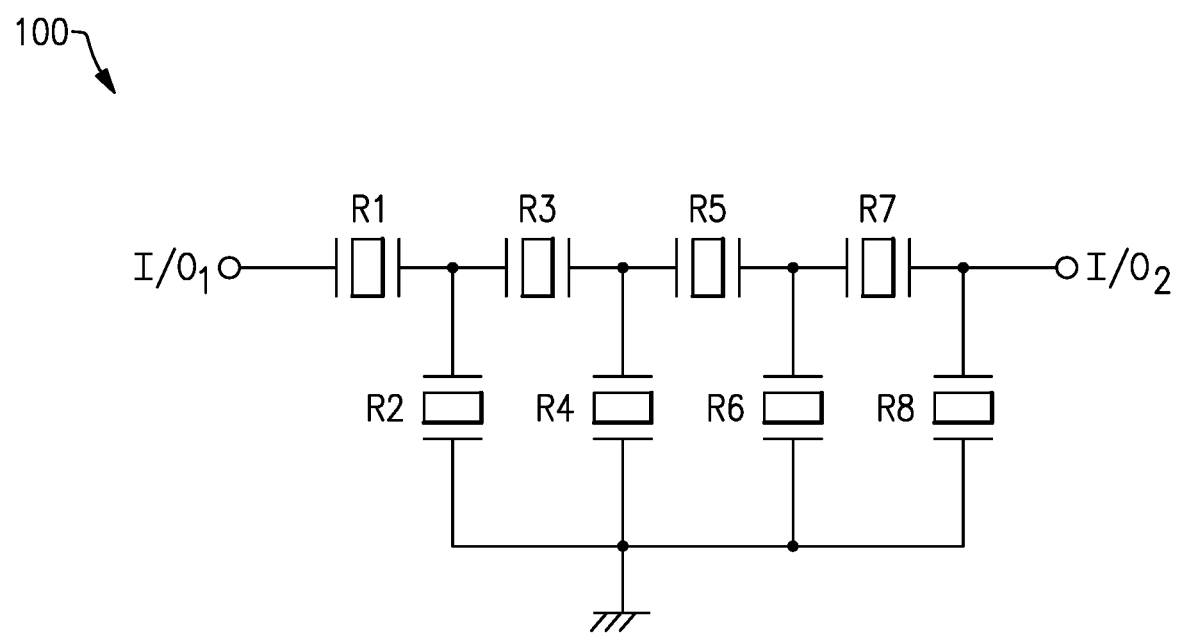
FIG. 14 is a schematic diagram of a ladder filter that includes an acoustic wave resonator according to an embodiment.

FIG. 14 is a schematic diagram of a ladder filter 100 that includes an acoustic wave resonator according to an embodiment. The ladder filter 100 is an example topology that can implement a band pass filter formed from acoustic wave resonators. In a band pass filter with a ladder filter topology, the shunt resonators can have lower resonant frequencies than the series resonators. The ladder filter 100 can be arranged to filter a radio frequency signal. As illustrated, the ladder filter 100 includes series acoustic wave resonators R1, R3, R5, and R7 and shunt acoustic wave resonators R2, R4, R6, and R8 coupled between a first input/output port $I/O_1$ and a second input/output port $I/O_2$. Any suitable number of series acoustic wave resonators can be in included in a ladder filter. Any suitable number of shunt acoustic wave resonators can be included in a ladder filter. The first input/output port $I/O_1$ can a transmit port and the second input/output port $I/O_2$ can be an antenna port. Alternatively, first input/output port $I/O_1$ can be a receive port and the second input/output port $I/O_2$ can be an antenna port.

Figure 15:
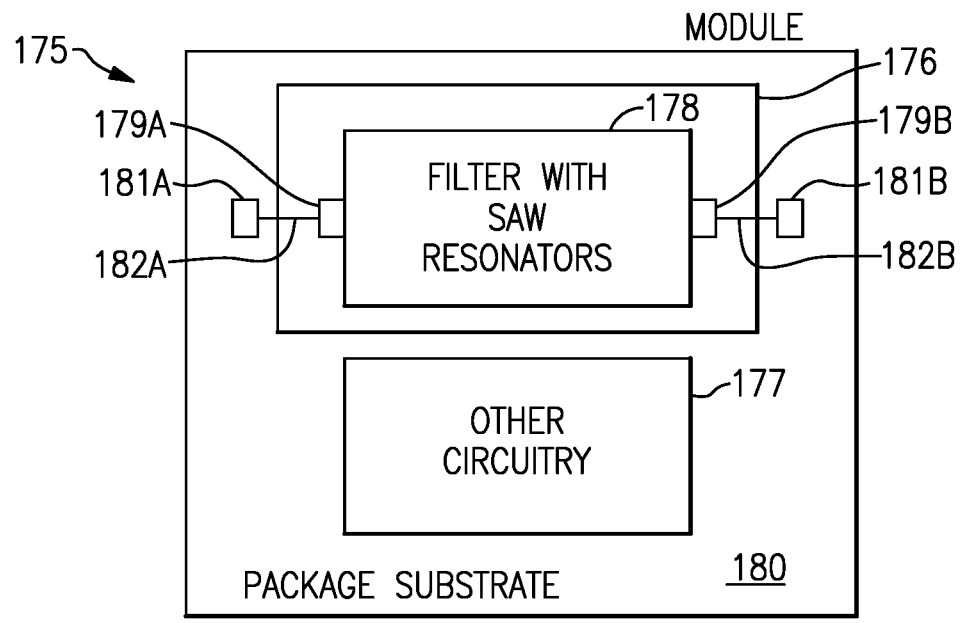
FIG. 15 is a schematic diagram of a radio frequency module that includes a surface acoustic wave resonator according to an embodiment.

FIG. 15 is a schematic diagram of a radio frequency module 175 that includes a surface acoustic wave component 176 according to an embodiment. The illustrated radio frequency module 175 includes the SAW component 176 and other circuitry 177. The SAW component 176 can include one or more SAW resonators with any suitable combination of features of the SAW resonators disclosed herein. The SAW component 176 can include a SAW die that includes SAW resonators.

The SAW component 176 shown in FIG. 15 includes a filter 178 and terminals 179A and 179B. The filter 178 includes SAW resonators. One or more of the SAW resonators can be implemented in accordance with any suitable principles and advantages of the surface acoustic wave resonator 4 of FIGS. 4A and 4B and/or any surface acoustic wave resonators disclosed herein. The filter 178 can be a TCSAW filter arranged as a band pass filter to filter radio frequency signals with frequencies below about 3.5 GHz in certain applications. The terminals 179A and 178B can serve, for example, as an input contact and an output contact. The SAW component 176 and the other circuitry 177 are on a common packaging substrate 180 in FIG. 14. The packaging substrate 180 can be a laminate substrate. The terminals 179A and 179B can be electrically connected to contacts 181A and 181B, respectively, on the packaging substrate 180 by way of electrical connectors 182A and 182B, respectively. The electrical connectors 182A and 182B can be bumps or wire bonds, for example. The other circuitry 177 can include any suitable additional circuitry. For example, the other circuitry can include one or more one or more power amplifiers, one or more radio frequency switches, one or more additional filters, one or more low noise amplifiers, the like, or any suitable combination thereof. The radio frequency module 175 can include one or more packaging structures to, for example, provide protection and/or facilitate easier handling of the radio frequency module 175. Such a packaging structure can include an overmold structure formed over the packaging substrate 180. The overmold structure can encapsulate some or all of the components of the radio frequency module 175.

Figure 16:
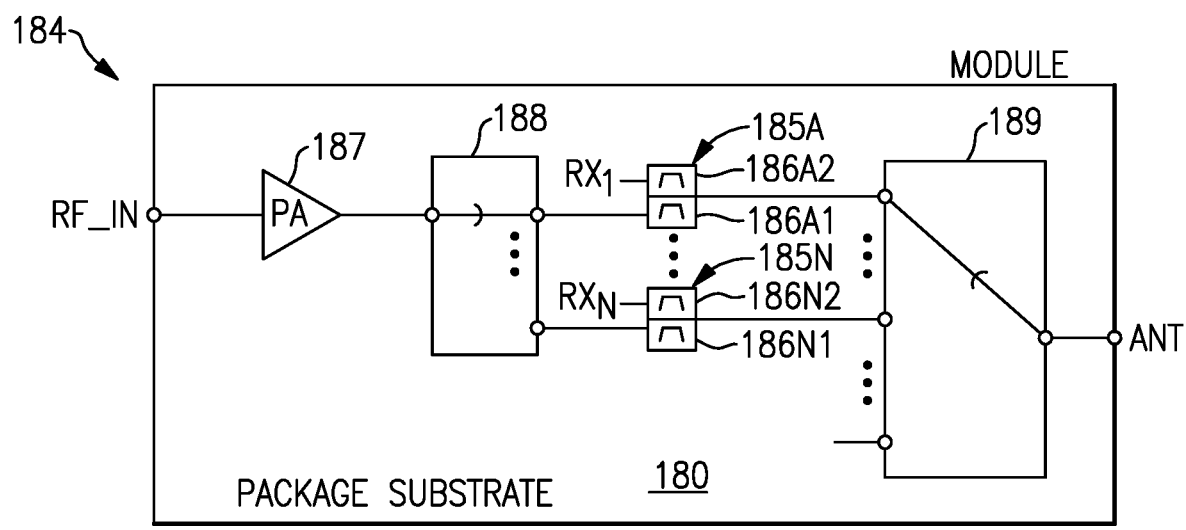
FIG. 16 is a schematic diagram of a radio frequency module that includes filters with surface acoustic wave resonators according to an embodiment.

FIG. 16 is a schematic diagram of a radio frequency module 184 that includes a surface acoustic wave resonator according to an embodiment. As illustrated, the radio frequency module 184 includes duplexers 185A to 185N that include respective transmit filters 186A1 to 186N1 and respective receive filters 186A2 to 186N2, a power amplifier 187, a select switch 188, and an antenna switch 189. In some instances, the module 184 can include one or more low noise amplifiers configured to receive a signal from one or more receive filters of the receive filters 186A2 to 186N2. The radio frequency module 184 can include a package that encloses the illustrated elements. The illustrated elements can be disposed on a common packaging substrate 180. The packaging substrate can be a laminate substrate, for example.

The duplexers 185A to 185N can each include two acoustic wave filters coupled to a common node. The two acoustic wave filters can be a transmit filter and a receive filter. As illustrated, the transmit filter and the receive filter can each be band pass filters arranged to filter a radio frequency signal. One or more of the transmit filters 186A1 to 186N1 can include one or more SAW resonators in accordance with any suitable principles and advantages disclosed herein. Similarly, one or more of the receive filters 186A2 to 186N2 can include one or more SAW resonators in accordance with any suitable principles and advantages disclosed herein. Although FIG. 16 illustrates duplexers, any suitable principles and advantages disclosed herein can be implemented in other multiplexers (e.g., quadplexers, hexaplexers, octoplexers, etc.) and/or in switch-plexers.

The power amplifier 187 can amplify a radio frequency signal. The illustrated switch 188 is a multi-throw radio frequency switch. The switch 188 can electrically couple an output of the power amplifier 187 to a selected transmit filter of the transmit filters 186A1 to 186N1. In some instances, the switch 188 can electrically connect the output of the power amplifier 187 to more than one of the transmit filters 186A1 to 186N1. The antenna switch 189 can selectively couple a signal from one or more of the duplexers 185A to 185N to an antenna port ANT. The duplexers 185A to 185N can be associated with different frequency bands and/or different modes of operation (e.g., different power modes, different signaling modes, etc.).

Figure 17:
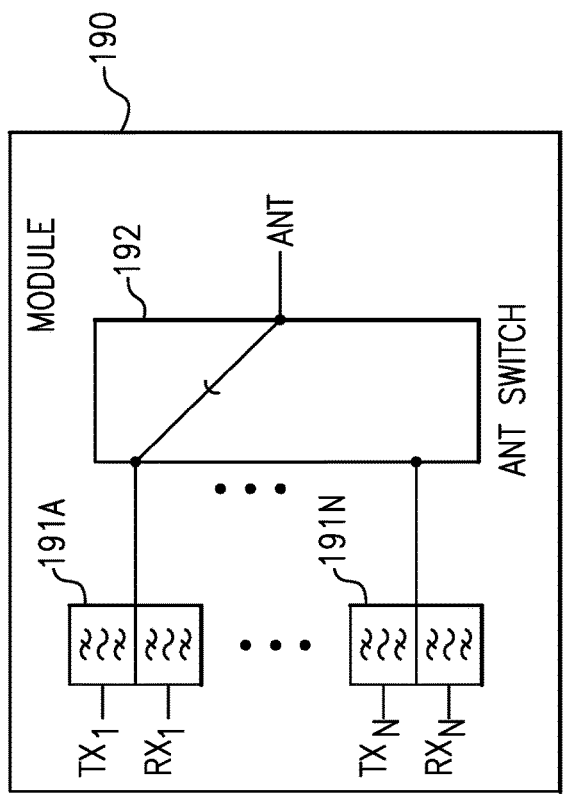
FIG. 17 is a schematic block diagram of a module that includes an antenna switch and duplexers that include a surface acoustic wave resonator according to an embodiment.

FIG. 17 is a schematic block diagram of a module 190 that includes duplexers 191A to 191N and an antenna switch 192. One or more filters of the duplexers 191A to 191N can include any suitable number of surface acoustic wave resonators in accordance with any suitable principles and advantages discussed herein. Any suitable number of duplexers 191A to 191N can be implemented. The antenna switch 192 can have a number of throws corresponding to the number of duplexers 191A to 191N. The antenna switch 192 can electrically couple a selected duplexer to an antenna port of the module 190.

Figure 18B:
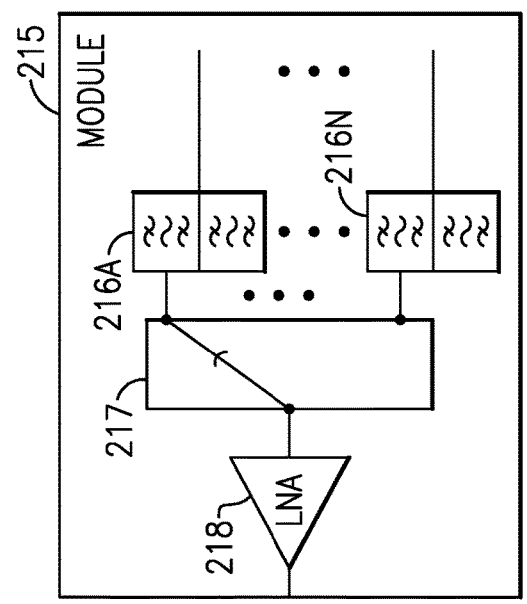
FIG. 18B is a schematic block diagram of a module that includes filters, a radio frequency switch, and a low noise amplifier according to an embodiment.
Figure 18A:
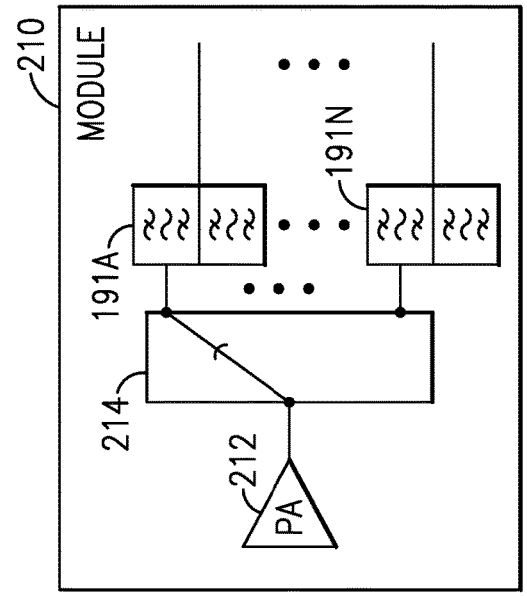
FIG. 18A is a schematic block diagram of a module that includes a power amplifier, a radio frequency switch, and duplexers that include a surface acoustic wave resonator according to an embodiment.

FIG. 18A is a schematic block diagram of a module 210 that includes a power amplifier 212, a radio frequency switch 214, and duplexers 191A to 191N in accordance with one or more embodiments. The power amplifier 212 can amplify a radio frequency signal. The radio frequency switch 214 can be a multi-throw radio frequency switch. The radio frequency switch 214 can electrically couple an output of the power amplifier 212 to a selected transmit filter of the duplexers 191A to 191N. One or more filters of the duplexers 191A to 191N can include any suitable number of surface acoustic wave resonators in accordance with any suitable principles and advantages discussed herein. Any suitable number of duplexers 191A to 191N can be implemented.

FIG. 18B is a schematic block diagram of a module 215 that includes filters 216A to 216N, a radio frequency switch 217, and a low noise amplifier 218 according to an embodiment. One or more filters of the filters 216A to 216N can include any suitable number of acoustic wave resonators in accordance with any suitable principles and advantages disclosed herein. Any suitable number of filters 216A to 216N can be implemented. The illustrated filters 216A to 216N are receive filters. In some embodiments (not illustrated), one or more of the filters 216A to 216N can be included in a multiplexer that also includes a transmit filter. The radio frequency switch 217 can be a multi-throw radio frequency switch. The radio frequency switch 217 can electrically couple an output of a selected filter of filters 216A to 216N to the low noise amplifier 218. In some embodiments (not illustrated), a plurality of low noise amplifiers can be implemented. The module 215 can include diversity receive features in certain applications.

Figure 19A:
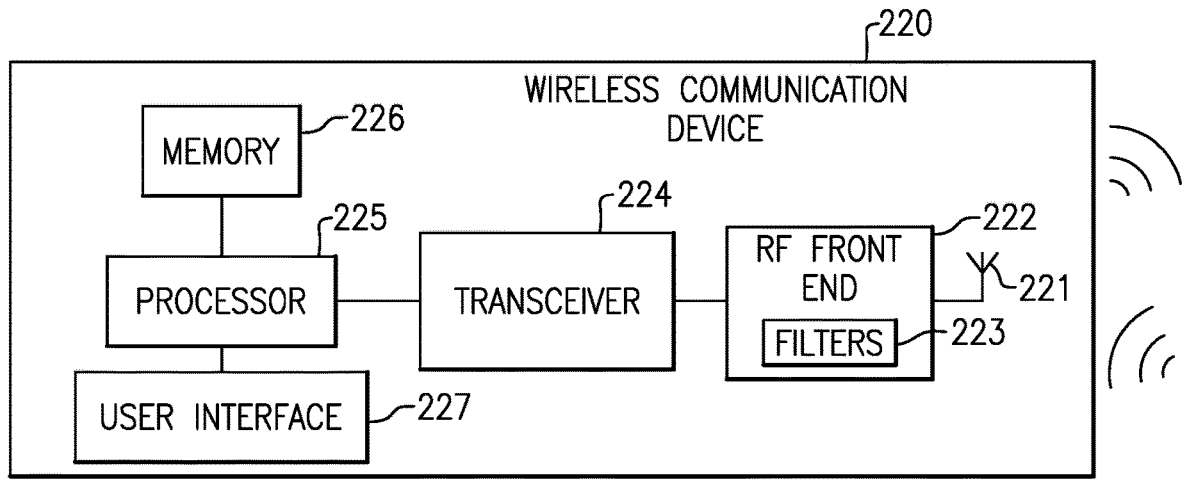
FIG. 19A is a schematic block diagram of a wireless communication device that includes a filter with a surface acoustic wave resonator in accordance with one or more embodiments.

FIG. 19A is a schematic diagram of a wireless communication device 220 that includes filters 223 in a radio frequency front end 222 according to an embodiment. The filters 223 can include one or more SAW resonators in accordance with any suitable principles and advantages discussed herein. The wireless communication device 220 can be any suitable wireless communication device. For instance, a wireless communication device 220 can be a mobile phone, such as a smart phone. As illustrated, the wireless communication device 220 includes an antenna 221, an RF front end 222, a transceiver 224, a processor 225, a memory 226, and a user interface 227. The antenna 221 can transmit/receive RF signals provided by the RF front end 222. Such RF signals can include carrier aggregation signals. Although not illustrated, the wireless communication device 220 can include a microphone and a speaker in certain applications.

The RF front end 222 can include one or more power amplifiers, one or more low noise amplifiers, one or more RF switches, one or more receive filters, one or more transmit filters, one or more duplex filters, one or more multiplexers, one or more frequency multiplexing circuits, the like, or any suitable combination thereof. The RF front end 222 can transmit and receive RF signals associated with any suitable communication standards. The filters 223 can include SAW resonators of a SAW component that includes any suitable combination of features discussed with reference to any embodiments discussed above.

The transceiver 224 can provide RF signals to the RF front end 222 for amplification and/or other processing. The transceiver 224 can also process an RF signal provided by a low noise amplifier of the RF front end 222. The transceiver 224 is in communication with the processor 225. The processor 225 can be a baseband processor. The processor 225 can provide any suitable base band processing functions for the wireless communication device 220. The memory 226 can be accessed by the processor 225. The memory 226 can store any suitable data for the wireless communication device 220. The user interface 227 can be any suitable user interface, such as a display with touch screen capabilities.

Figure 19B:
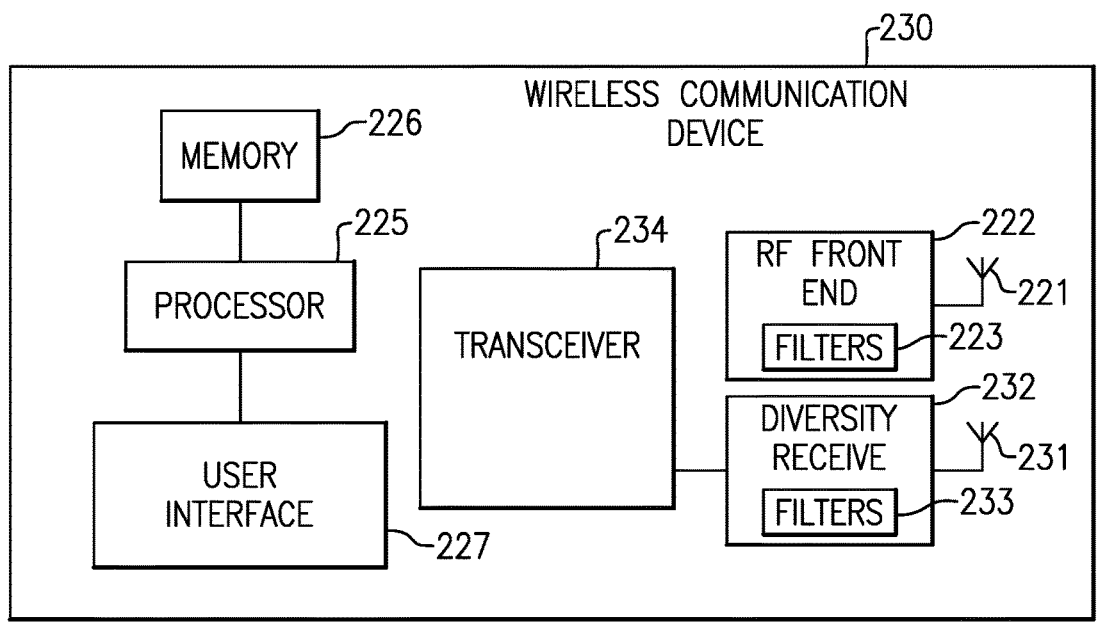
FIG. 19B is a schematic block diagram of another wireless communication device that includes a filter with a surface acoustic wave resonator in accordance with one or more embodiments.

FIG. 19B is a schematic diagram of a wireless communication device 230 that includes filters 223 in a radio frequency front end 222 and a second filter 233 in a diversity receive module 232. The wireless communication device 230 is like the wireless communication device 200 of FIG. 19A, except that the wireless communication device 230 also includes diversity receive features. As illustrated in FIG. 19B, the wireless communication device 230 includes a diversity antenna 231, a diversity module 232 configured to process signals received by the diversity antenna 231 and including filters 233, and a transceiver 234 in communication with both the radio frequency front end 222 and the diversity receive module 232. The filters 233 can include one or more SAW resonators that include any suitable combination of features discussed with reference to any embodiments discussed above.

Although embodiments disclosed herein relate to surface acoustic wave resonators, any suitable principles and advantages disclosed herein can be applied to other types of acoustic wave resonators and/or acoustic wave devices that include an IDT electrode, such as Lamb wave resonators and/or boundary wave resonators. For example, any suitable combination of features of the tilted and rotated IDT electrodes disclosed herein can be applied to a Lamb wave resonator (for example, a Lamb wave resonator) and/or to a boundary wave device (for example, a boundary wave resonator).

Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes some example embodiments, the teachings described herein can be applied to a variety of structures. Any of the principles and advantages discussed herein can be implemented in association with RF circuits configured to process signals in a frequency range from about 30 kilohertz (kHz) to 300 GHz, such as in a frequency range from about 410 MHz to 8.5 GHz.

Aspects of this disclosure can be implemented in various electronic devices. Examples of the electronic devices can include, but are not limited to, consumer electronic products, parts of the consumer electronic products such as packaged radio frequency modules and/or packaged filter components, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a stereo system, a digital music player, a radio, a camera such as a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. All numerical values, such as values for rotation angle and tilt angle, in this application and the claims are intended to encompass similar values within error of available measurement techniques. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. An acoustic wave device comprising:
a multilayer piezoelectric substrate; and
an interdigital transducer electrode over the multilayer piezoelectric substrate, the interdigital transducer electrode including a first layer and a second layer over the first layer, the interdigital transducer electrode having a non-zero rotation angle and a negative tilt angle, the acoustic wave device being configured to generate a surface acoustic wave having a wavelength L, the interdigital transducer electrode includes a first bus bar, a second bus bar, a first set of fingers extending from the first bus bar, and a second set of fingers extending from the second bus bar, wherein a width between a finger to an adjacent finger is in a range between 20 L to 40 L.

2. The acoustic wave device of claim 1 wherein the multilayer piezoelectric substrate includes a support substrate, a piezoelectric layer over the support substrate, and an intermediate layer between the support substrate and the piezoelectric layer.

3. The acoustic wave device of claim 1 wherein the first layer of the interdigital transducer electrode has a density greater than the second layer of the interdigital transducer electrode.

4. The acoustic wave device of claim 3 wherein the first layer includes molybdenum and the second layer includes aluminum.

5. The acoustic wave device of claim 4 wherein the first layer has a thickness less than 0.05 L.

6. The acoustic wave device of claim 5 wherein the second layer has a thickness in a range between 0.03 L and 0.1 L.

7. The acoustic wave device of claim 1 wherein first and second sides of a chip that includes the acoustic wave device extend parallel with a bus bar of the interdigital transducer electrode and third and fourth sides of the chip that extend perpendicular to the first and second sides are non-parallel with fingers of the interdigital transducer electrode.

8. The acoustic wave device of claim 1 wherein the interdigital transducer electrode includes dummy fingers and non-dummy fingers.

9. The acoustic wave device of claim 8 wherein the dummy fingers are shorter than the non-dummy fingers.

10. The acoustic wave device of claim 1 wherein the first set of fingers and second set of fingers of the interdigital transducer electrode have varying pitches.

11. The acoustic wave device of claim 1 further comprising a pair of reflectors over the multilayer piezoelectric substrate, the interdigital transducer electrode positioned longitudinally between the pair of reflectors.

12. The acoustic wave device of claim 11 further wherein the non-zero rotation angle and the negative tilt angle of the interdigital transducer electrode with the pair of reflectors reduce an area on the multilayer piezoelectric substrate needed for the interdigital transducer electrode.

13. The acoustic wave device of claim 12 wherein a pitch of the interdigital transducer electrode is different than a pitch of the pair of reflectors.

14. A multilayer piezoelectric substrate surface acoustic wave device comprising:
   a multilayer piezoelectric substrate; and
   an interdigital transducer electrode over the multilayer piezoelectric-layer substrate, the interdigital transducer electrode including a first layer and a second layer over the first layer, the interdigital transducer electrode having a negative tilt angle and a non-zero rotation angle, the negative tilt angle configured to suppress spurious responses, the acoustic wave device being configured to generate a surface acoustic wave having a wavelength L, the interdigital transducer electrode includes a first bus bar, a second bus bar, a first set of fingers extending from the first bus bar, and a second set of fingers extending from the second bus bar, wherein a width between a finger to an adjacent finger is in a range between 20 L to 40 L.

15. The acoustic wave device of claim 14 wherein the first layer includes molybdenum and the second layer includes aluminum.

16. The acoustic wave device of claim 14 further comprising a pair of reflectors over the multilayer piezoelectric substrate, the interdigital transducer electrode positioned longitudinally between the pair of reflectors, the non-zero rotation angle and the negative tilt angle of the interdigital transducer electrode with the pair of reflectors reduce an area on the multilayer piezoelectric substrate needed for the interdigital transducer electrode.

17. An acoustic wave device comprising:
   a multilayer piezoelectric substrate; and
   an interdigital transducer electrode over the multilayer piezoelectric substrate, the interdigital transducer electrode including a first layer and a second layer over the first layer, the first layer being more dense than the second layer, the interdigital transducer electrode having a non-zero rotation angle and a negative tilt angle, the acoustic wave device being configured to generate a surface acoustic wave having a wavelength L, the first layer having a thickness less than 0.05 L and the second layer having a thickness in a range between 0.03 L and 0.1 L, the interdigital transducer electrode includes a first bus bar, a second bus bar, a first set of fingers extending from the first bus bar, and a second set of fingers extending from the second bus bar, wherein a width between a finger to an adjacent finger is in a range between 20 L to 40 L.

18. The acoustic wave device of claim 17 further comprising a pair of reflectors over the multilayer piezoelectric substrate, the interdigital transducer electrode positioned longitudinally between the pair of reflectors.

19. The acoustic wave device of claim 18 wherein the first set of fingers and second set of fingers have varying pitches.

20. The acoustic wave device of claim 18 wherein the non-zero rotation angle and the negative tilt angle of the interdigital transducer electrode with the pair of reflectors reduce an area on the multilayer piezoelectric substrate needed for the interdigital transducer electrode.

* * * * *